(12) United States Patent
Hu et al.

(10) Patent No.: US 8,552,959 B2
(45) Date of Patent: Oct. 8, 2013

(54) SHIFT REGISTER AND A GATE-LINE DRIVE DEVICE USED FOR A LIQUID CRYSTAL DISPLAY

(75) Inventors: Ming Hu, Beijing (CN); Yubo Xu, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 489 days.

(21) Appl. No.: 12/732,869

(22) Filed: Mar. 26, 2010

(65) Prior Publication Data

US 2010/0245337 A1 Sep. 30, 2010

(30) Foreign Application Priority Data

Mar. 27, 2009 (CN) .......................... 2009 1 0080787

(51) Int. Cl.
*G09G 3/36* (2006.01)
(52) U.S. Cl.
USPC ........................................................ 345/100
(58) Field of Classification Search
USPC ................... 345/87–104; 315/169.2
See application file for complete search history.

(56) References Cited

U.S. PATENT DOCUMENTS

| | | | | |
|---|---|---|---|---|
| 2004/0189585 A1* | 9/2004 | Moon | ............................ | 345/100 |
| 2005/0275614 A1* | 12/2005 | Kim et al. | ..................... | 345/100 |
| 2006/0279511 A1* | 12/2006 | Uh et al. | ...................... | 345/100 |
| 2007/0171115 A1 | 7/2007 | Kim et al. | | |
| 2007/0274433 A1 | 11/2007 | Tobita | | |
| 2007/0296681 A1* | 12/2007 | Kim et al. | ..................... | 345/100 |
| 2008/0036725 A1* | 2/2008 | Lee et al. | ...................... | 345/100 |
| 2008/0055225 A1* | 3/2008 | Pak et al. | ......................... | 345/96 |
| 2008/0219401 A1* | 9/2008 | Tobita | ............................. | 377/79 |
| 2009/0058781 A1 | 3/2009 | Xu et al. | | |

FOREIGN PATENT DOCUMENTS

| | | |
|---|---|---|
| CN | 101000417 A | 7/2007 |
| CN | 101042937 A | 9/2007 |
| CN | 101377595 A | 3/2009 |

* cited by examiner

*Primary Examiner* — Chanh Nguyen
*Assistant Examiner* — Sanghyuk Park
(74) *Attorney, Agent, or Firm* — Ladas & Parry LLP

(57) ABSTRACT

A shift register and a gate-line drive device relate to liquid crystal display. The shift register comprises: first thin film transistor, second thin film transistor, third thin film transistor, fourth thin film transistor and fifth thin film transistor; capacitor, connected between first node and the output terminal of the present stage; first operation modular, connected between first operation signal terminal and the first node, and connected to the low level signal terminal; second operation modular, connected between second operation signal terminal and the first node, and connected to the low level signal terminal, wherein, the first operation modular and the second operation modular are alternatively operated, and the first operation modular and the second operation modular are used to maintain both of the gate and drain of the second thin film transistor at low level respectively, when the shift register is not operated.

21 Claims, 18 Drawing Sheets

SHIFT REGISTER AND A GATE-LINE DRIVE
DEVICE USED FOR A LIQUID CRYSTAL
DISPLAY

BACKGROUND

The embodiments of the present invention relate to the field of a liquid crystal display, and to a shift register and a gate-line drive device therefor.

In recent years, products of liquid crystal display (LCD) are developing very fast, more and more thin film transistor liquid crystal displays with high quality are put to the market, its application fields are constantly expanded.

The pixel array of the liquid crystal display comprises interlaced several rows of gate scan lines and several columns of data lines. Wherein, the gate-line drive device consisted of several shift registers provides signal for the several rows of gate scan lines of the pixel array.

The increase of ON voltage of the thin film transistor directly relates to the voltages on both terminals of gate and source, the greater the voltages on both terminals of gate and source, the longer the time for applying the voltage, and hence the bigger the increase of the ON voltage. FIG. 1 is a relationship diagram illustrating the relation between the ON voltage shift and time with the thin film transistor constantly under the gate bias voltage. As shown in FIG. 1, the vertical direction represents the ON voltage of the thin film transistor, the horizontal direction represents the time during which the voltage is continually applied. It is noticed from the figure that, if the voltage is constantly applied to one thin film transistor, then the ON voltage of the thin film transistor will constantly increase, at the end causing the thin film transistor unable to be turned on, eventually causing the circuit inoperative.

In a shift register, the duty ratio of silicon thin film transistor is relatively large, basically between 5%-10% or even more. Under the positive bias voltage for the gate, the operation current of the thin film transistor will drop, and the shift of the ON voltage becomes higher and higher, eventually preventing the thin film transistor from normal operation, thus the stability of the shift register is affected.

SUMMARY

An embodiment of the present invention provide a shift register, comprising: a first thin film transistor having a gate and a drain connected together to a trigger signal terminal, and a source connected to a first node as a pull-up node; a second thin film transistor having a gate connected to the first node, a drain connected to a clock signal terminal, and a source connected to an output terminal of the present stage; a third thin film transistor having a gate connected to the clock signal terminal, a drain connected to the first node, and a source connected to the output terminal of the present stage; a fourth thin film transistor having a gate connected to a feedback signal terminal, a drain connected to the first node, and a source connected to a low level signal terminal; a fifth thin film transistor having a gate connected to a feedback signal terminal, a drain connected to the output terminal of the present stage, and a source connected to a low level signal terminal; a capacitor, connected between the first node and the output terminal of the present stage; a first operation modular, connected between a first operation signal terminal and the first node, and connected to the low level signal terminal; and a second operation modular, connected between a second operation signal terminal and the first node, and connected to the low level signal terminal. The first operation modular and the second operation modular are alternatively operated, and the first operation modular and the second operation modular are used to maintain both of the gate and source of the second thin film transistor at low level respectively, when the shift register is not operated.

Another embodiment of the invention provides a gate-line drive device comprising the shift register as described above, comprising a plurality of shift registers connected with a signal generation unit. The shift register has a clock signal terminal, a first operation signal terminal, a second operation signal terminal, an output terminal of the present stage, a trigger signal terminal receiving an output signal from the previous stage of shift register and an feedback signal terminal receiving an output signal from the next stage of shift register; and the shift register receives at least two of the input signals sent from the signal generation unit.

Further another embodiment of the invention provides a gate-line drive device comprising the shift register according to claim 1, comprising plurality of shift registers connected in serial. The shift register has a clock signal terminal, a first operation signal terminal, a second operation signal terminal, an output terminal of the present stage, a trigger signal terminal receiving an output signal from the previous stage of shift register and a feedback signal terminal receiving an output signal from the next second stage of shift register; and the shift register receives at least two of the input signals sent from a signal generation unit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE EMBODIMENTS

The embodiments of the present invention provide a shift register and a gate-line drive device therefor, which decrease the shift of the ON voltage and maintains the stability of the circuit.

Next, the shift register and the gate-line drive device therefor of the embodiment of the embodiments of the present invention are described in details with reference to the accompanying figures.

Figure 1:
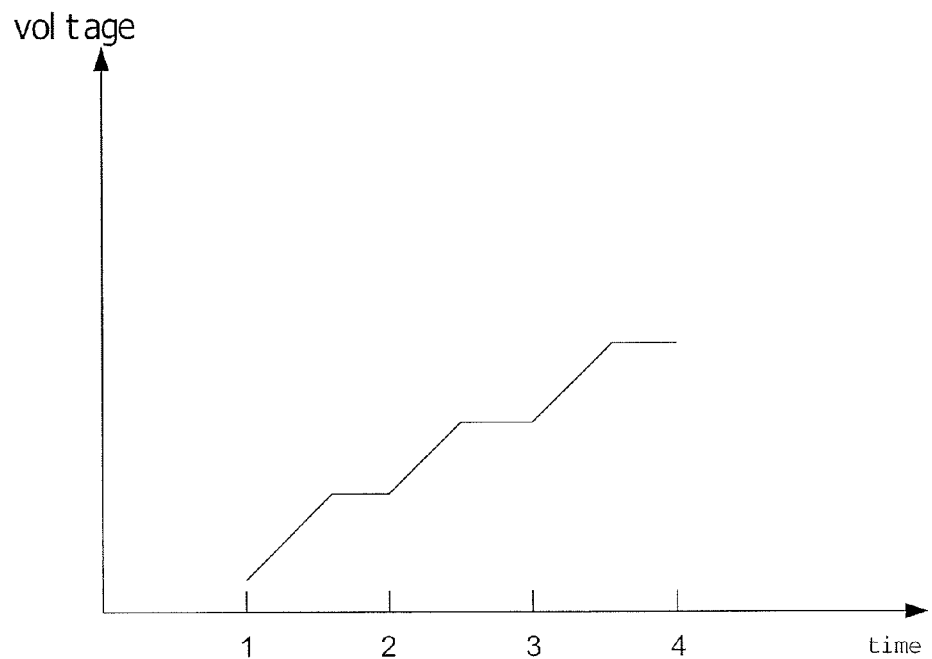
FIG. 1 is a diagram illustrating the relationship between the ON voltage shift and time with the thin film transistor always under the gate bias voltage in the prior art.
Figure 2:
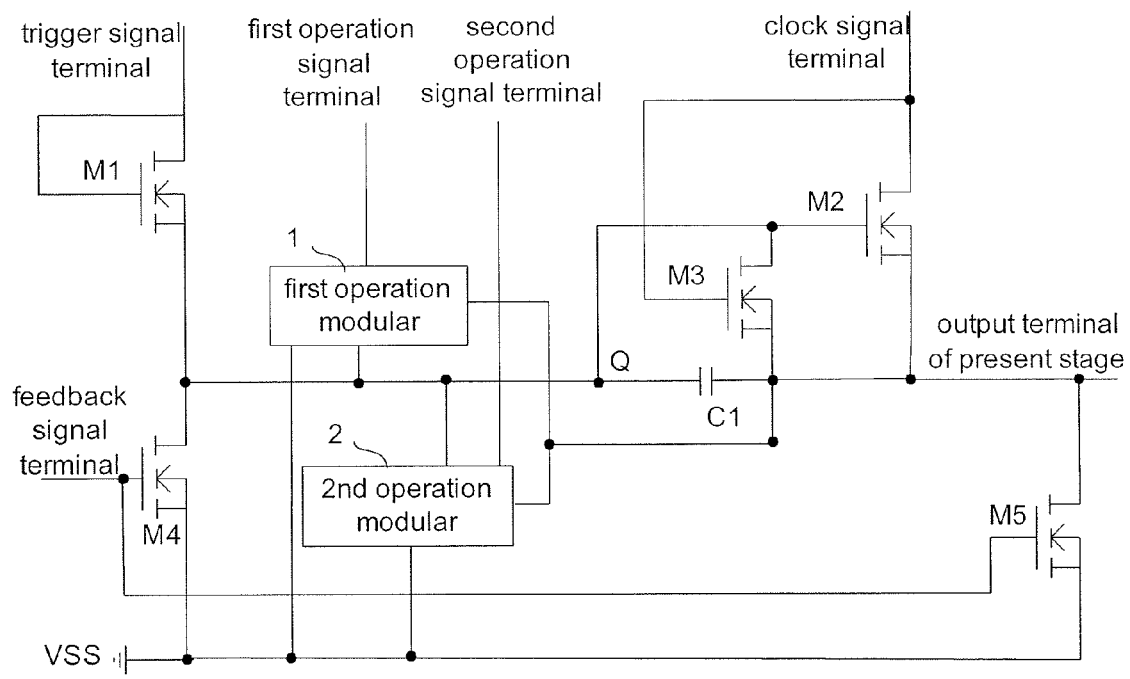
FIG. 2 is an illustrative diagram of a structure of the shift register according to an embodiment of the present invention.

FIG. 2 is an illustrative diagram of a structure of the shift register of an embodiment of the present invention. As shown in FIG. 2, the shift register of an embodiment of the present invention mainly comprises five hydrogenated amorphous silicon thin film transistors, a storage capacitor, a first operation modular 1, a second operation modular 2 and corresponding input and output terminals, wherein, a first thin film transistor M1 having a gate and a drain connected together to a trigger signal terminal, and a source connected to a first node Q as a pull-up node, is used to control the shift register to start operation when receiving a high level signal; a second thin film transistor M2 having a gate connected to the first node Q, a drain connected to a clock signal terminal, and a source connected to an output terminal of the present stage is used to provide a high level output for the present stage of output terminal; a third thin film transistor M3 having a gate connected to the clock signal terminal, a drain connected to the first node Q, and a source connected to the output terminal of the present stage is used to accelerate the transition of the output terminal of the present stage from a low level to a high level when the clock signal becomes a high level, thereby reducing the extension of the rising; a fifth thin film transistor M5 has a gate connected to a feedback signal terminal, a drain connected to the output terminal of the present stage, and a source connected to a low level signal terminal VSS; a fourth thin film transistor M4 having a gate connected to a feedback signal terminal, a drain connected to the first node Q, and a source connected to a low level signal terminal VSS is used to receive a feedback signal, keeping the first node Q at the low level when the feedback signal is a high level, so as to maintain a low level at the gate of second thin film transistor M2; the capacitor C, connected between the first node Q and the output terminal of the present stage; the first operation modular 1, connected between the first operation signal terminal and the first node Q, and connected to the low level signal terminal VSS; the second operation modular 2, connected between the second operation signal terminal and the first node Q, and connected to the low level signal terminal VSS; wherein, the first operation modular 1 and the second operation modular 2 are alternatively operated, and the first operation modular 1 and the second operation modular 2 are used to maintain a low level at the gate and the source of the second thin film transistor M2 respectively, when the shift register is not operated.

The shift register provided in the embodiments of the present invention reduces the shift of the ON voltage by the alternative operation of the first operation modular and the second operation modular, thereby guaranteeing the stability of the circuit.

Figure 3:
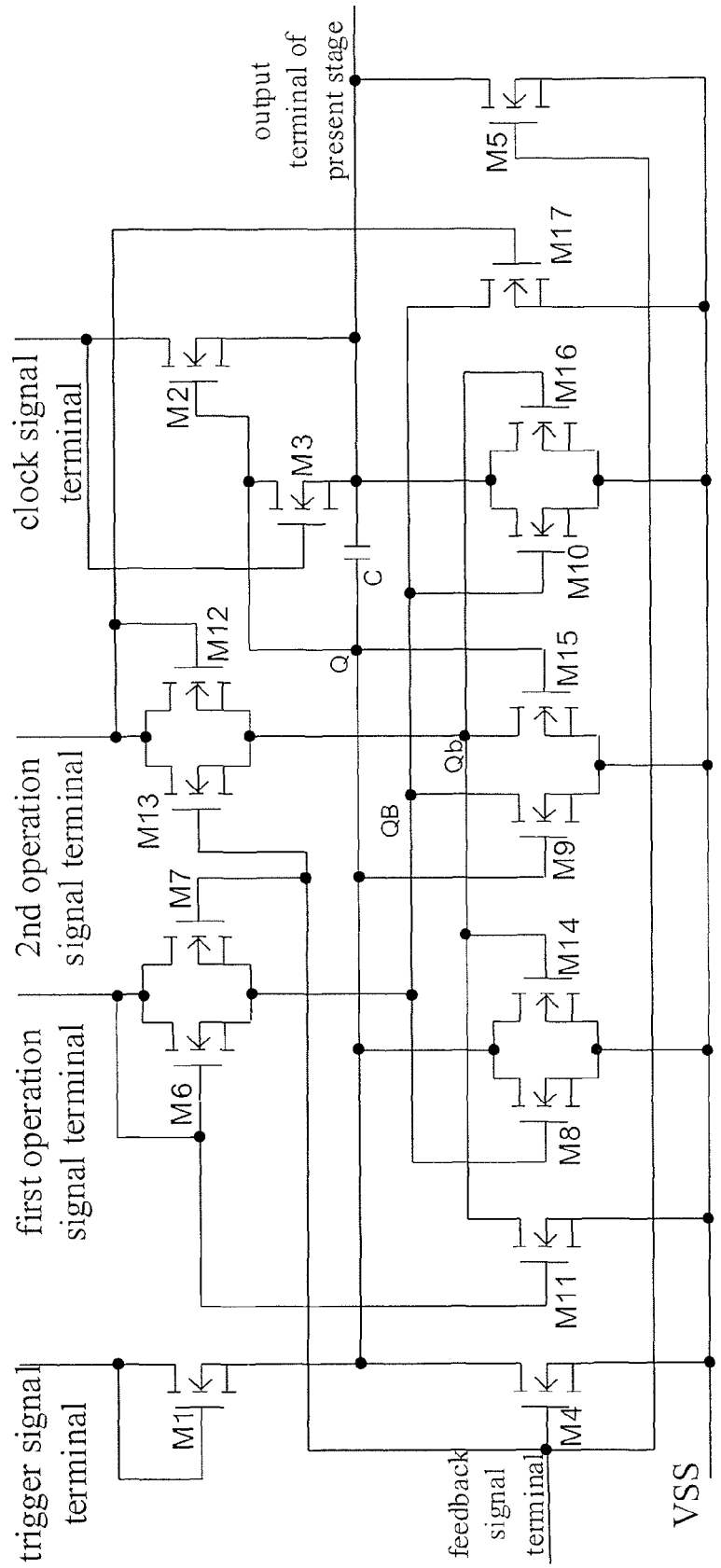
FIG. 3 is an illustrative diagram of a structure of the shift register according to a first embodiment of the present invention.

FIG. 3 is an illustrative diagram of a structure of the shift register according to a first embodiment of the present invention. The main structure of the shift register of the present embodiment comprises 17 hydrogenated amorphous silicon thin film transistors, a storage capacitor, and corresponding input and output terminals. 17 hydrogenated amorphous silicon thin film transistors are a first thin film transistor M1, a second thin film transistor M2, a third thin film transistor M3, a fourth thin film transistor M4, a fifth thin film transistor M5, a sixth thin film transistor M6, a seventh thin film transistor M7, a eighth thin film transistor M8, a ninth thin film transistor M9, a tenth thin film transistor M10, a eleventh thin film transistor M11, a twelfth thin film transistor M12, a thirteenth thin film transistor M13, a fourteenth thin film transistor M14, a fifteenth thin film transistor M15, a sixteenth thin film transistor M16 and a seventeenth thin film transistor M17. The storage capacitor is a capacitor C, the input terminal and output terminal comprise a low level signal terminal VSS, an output terminal of the present stage, trigger signal terminal for receiving a trigger signal, a feedback signal terminal for receiving a feedback signal, a first operation signal terminal, a second operation signal terminal and a clock signal terminal.

In particular, the first thin film transistor M1 has a gate and a drain connected together to the trigger signal terminal, and a source connected to a first node Q as a pull-up node; the second thin film transistor M2 has a gate connected to the first node Q, a drain connected to the clock signal terminal, and a source connected to the output terminal of the present stage; the third thin film transistor M3 has a gate connected to the clock signal terminal, a drain connected to the first node Q, and a source connected to the output terminal of the present stage; the fourth thin film transistor M4 has a gate connected to the feedback signal terminal, a drain connected to the first node Q, and a source connected to the low level signal terminal VSS; the fifth thin film transistor M5 has a gate connected to the feedback signal terminal, a drain connected to the output terminal of the present stage, and a source connected to the low level signal terminal VSS; the sixth film transistor M6 has a gate and a drain connected to the first operation signal terminal, and a source connected to a second node QB as a pull-down node; the seventh thin film transistor M7 having a gate connected to the feedback signal terminal, a drain connected to the first operation signal terminal, and a source connected to the second node QB; the eighth thin film transistor M8 has a gate connected to the second node QB, a drain connected to the first node Q, and a source connected to the low level signal terminal VSS; the ninth thin film transistor M9 has a gate connected the first node Q, a drain connected to the second node QB, and a source connected to the low level signal terminal VSS; the tenth thin film transistor M10 has a gate connected to the second node QB, a drain connected to the output terminal of the present stage, and a source connected to the low level signal terminal VSS; the eleventh thin film transistor M11 has a gate connected to the first operation signal terminal, a drain connected to the third node Qb as a pull-down node, and a source connected to the low level signal terminal VSS; the twelfth thin film transistor M12 has a gate and a drain connected to the second operation signal terminal, and a source connected to the third node Qb as a pull-down node; the thirteenth thin film transistor M13 has a gate connected to the feedback signal terminal, a drain connected to the second operation signal terminal, and a source connected to the third node Qb; the fourteenth thin film transistor M14 has a gate connected to the third node Qb, a drain connected to the first node Q, and a source connected to the low level signal terminal VSS; the fifteenth thin film transistor M15 has a gate connected to the first node Q, a drain connected to the third node Qb, and a source connected to the low level signal terminal VSS; the sixteenth thin film transistor M16 has a gate connected to the third node Qb, a drain connected to the output terminal of the present stage, and a source connected to the low level signal terminal VSS; the seventeenth thin film transistor M17 has a gate connected to the second operation signal terminal, a drain connected to second node QB, and a source connected to the low level signal terminal VSS; the capacitor C is connected between the first node Q and the output terminal of the present stage.

The sixth thin film transistor M6, the seventh thin film transistor M7, the eighth thin film transistor M8, the ninth thin film transistor M9, the tenth thin film transistor M10 and the eleventh thin film transistor M11 form the first operation modular of the present embodiment, the first operation modular is used to maintain both of the gate and source of the second thin film transistor M2 at low level when the shift register is not operated, and maintain the stability of the circuit, thereby playing a role against the interference. The twelfth thin film transistor M12, the thirteenth thin film transistor M13, the fourteenth thin film transistor M14, the fifteenth thin film transistor M15, the sixteenth thin film transistor M16 and the seventeenth thin film transistor M17 are consisted of the second operation modular of the present embodiment, the second operation modular plays the same role as the first operation modular. When the first operation modular is operated, the second operation modular is not operated; when the second operation modular is operated, the first operation modular is not operated, i.e. the first operation modular and the second operation modular are alternatively operated. It should be noted, if there is only one operation modular, then at most situations, the thin film transistors of the operation modular are in a ON status, which causes the ON voltage of these part of the transistors is likely increased, than causes the thin film transistors unable to operate, which finally cause the whole modular unable to normally operate. Using two operation modular wherein one operation modular is operated and the thin film transistors of the other operation modular are in a state of not operated, the ON voltage of the thin film transistors could slowly be recovered, thus it could increase the stability of the circuit, and increase the operating time of the circuit.

Further, the sixth thin film transistor M6 and the thirteenth thin film transistor M13 have the same structure; the seventh thin film transistor M7 and the twelfth thin film transistor M12 have the same structure; the eighth thin film transistor M8 and the fourteenth thin film transistor M14 have the same structure; the ninth thin film transistor M9 and the fifteenth thin film transistor M15 have the same structure; the tenth thin film transistor M10 and the sixteenth thin film transistor M16 have the same structure; the eleventh thin film transistor M11 and the seventeenth thin film transistor M17 have the same structure.

In practical application, the above technical solution of the present embodiment is not only applied to the hydrogenated amorphous silicon thin film transistor, but also applied to other thin film transistors.

It should be noticed that, the above embodiment is only one embodiment of the shift register of the present invention, but not limited thereto.

The embodiment of the present invention also provides a gate-line drive device, comprising several shift registers connected in serial, and five shift registers connected in serial form a shift register set. Each shift register has a clock signal terminal, a first operation signal terminal, a second operation signal terminal, an output terminal of the present stage sending a gate-line drive signal to corresponding gate line, a trigger signal terminal for receiving a trigger signal as a initial signal of the present stage of the shift register and a feedback signal terminal, in addition, each shift register is also connected to a low level signal terminal.

Figure 4:
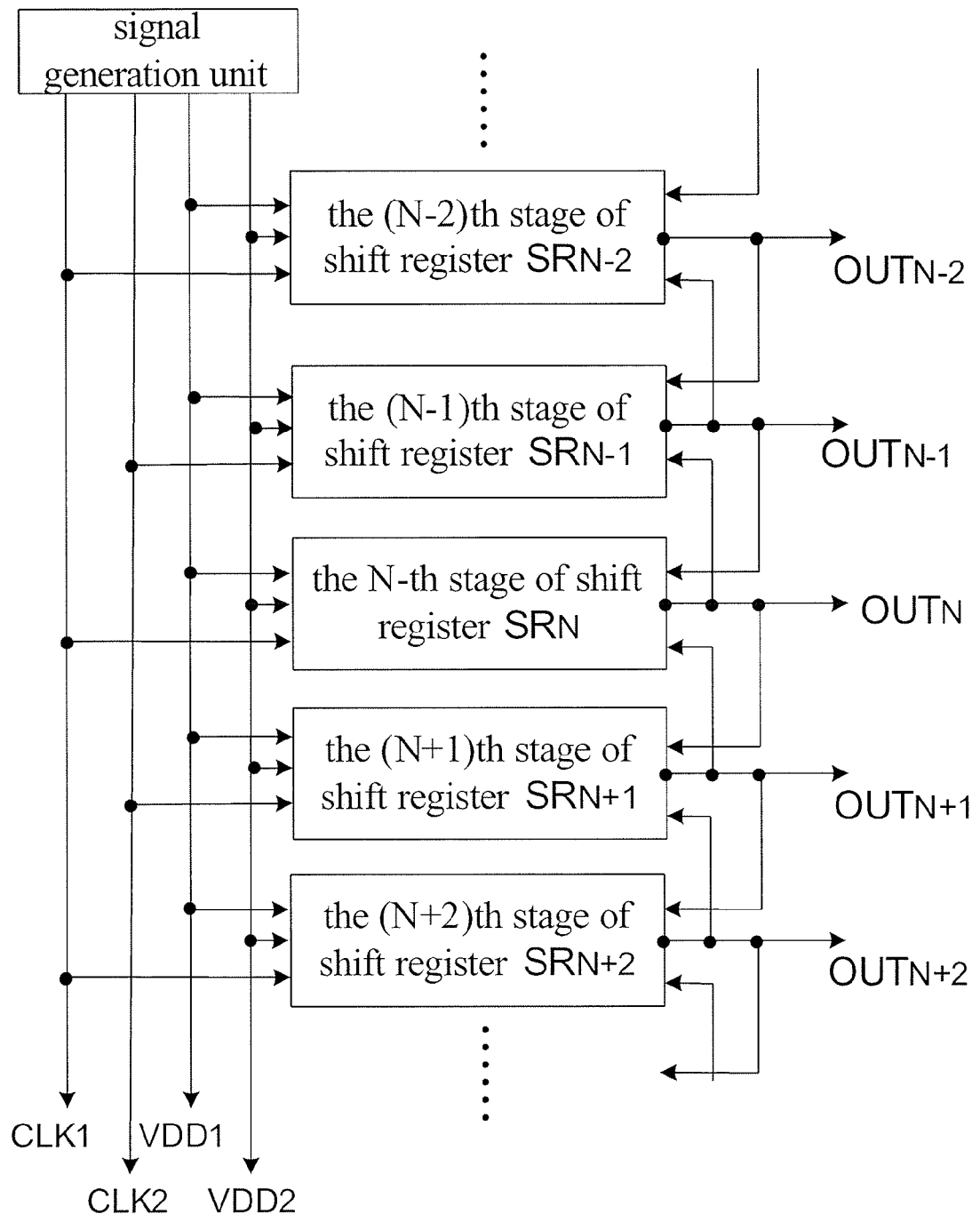
FIG. 4 is an illustrative diagram of a structure of the gate-line drive device according to the first embodiment of the present invention.

FIG. 4 is an illustrative diagram of a structure of the gate-line drive device according to a first embodiment of the present invention. As shown in FIG. 4, the five shift registers in the shift register set are the (N−2)-th stage of shift register $SR_{N-2}$, the (N−1)-th stage of shift register $SR_{N-1}$, the N-th stage of shift register $SR_N$, the (N+1)-th stage of shift register $SR_{N+1}$ and the (N+2)-th stage of shift register $SR_{N+2}$, respectively, each shift register has the structure illustrated in FIG. 3.

In the present embodiment, the input signals sent from the signal generation unit are a first operation signal VDD1, a second operation signal VDD2, and a first clock signal CLK1 and a second clock signal CLK2 which are periodically alternated. Thus, the first operation signal terminal receives the first operation signal VDD1; the second operation signal terminal receives the second operation signal VDD2; the clock signal terminal receives one of the first clock signal CLK1 and the second clock signal CLK2.

Figure 5:
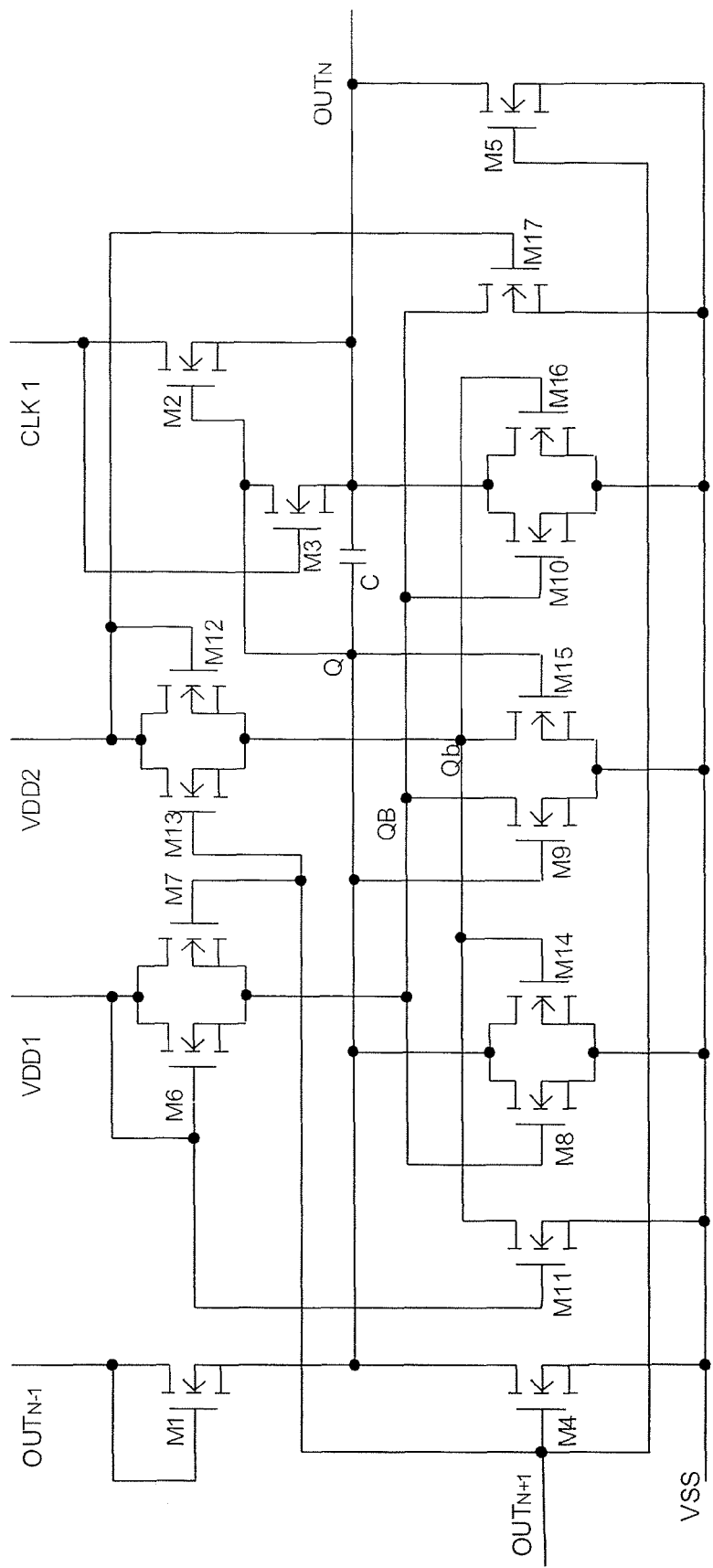
FIG. 5 is an illustrative diagram of a structure of the N-th stage of shift register of the gate-line drive device illustrated in FIG. 4.

FIG. 5 is an illustrative diagram of a structure of the N-th stage of shift register of the gate-line drive device illustrated in FIG. 4. As shown in FIG. 5, taking the N-th stage of shift register $SR_N$ as an example, the details of the input terminal and output terminal thereof are that: the signal received by the first operation signal terminal is VDD1, the signal received by the second operation signal terminal is VDD2, the signal received by the clock signal terminal is CLK1, a feedback signal terminals are $OUT_{N+1}$ receiving a feedback signal from the next stage of shift register, a trigger signal terminal $OUT_{N-1}$ receiving an output signal from the output terminal of the previous stage (the (N−1)-th stage) of shift register, the output terminal of the present stage is $OUT_N$, wherein, the output terminal $OUT_N$ of the present stage also outputs a trigger signal to the next stage (the (N+1)-th stage) of shift register as its initial signal.

Figure 6:
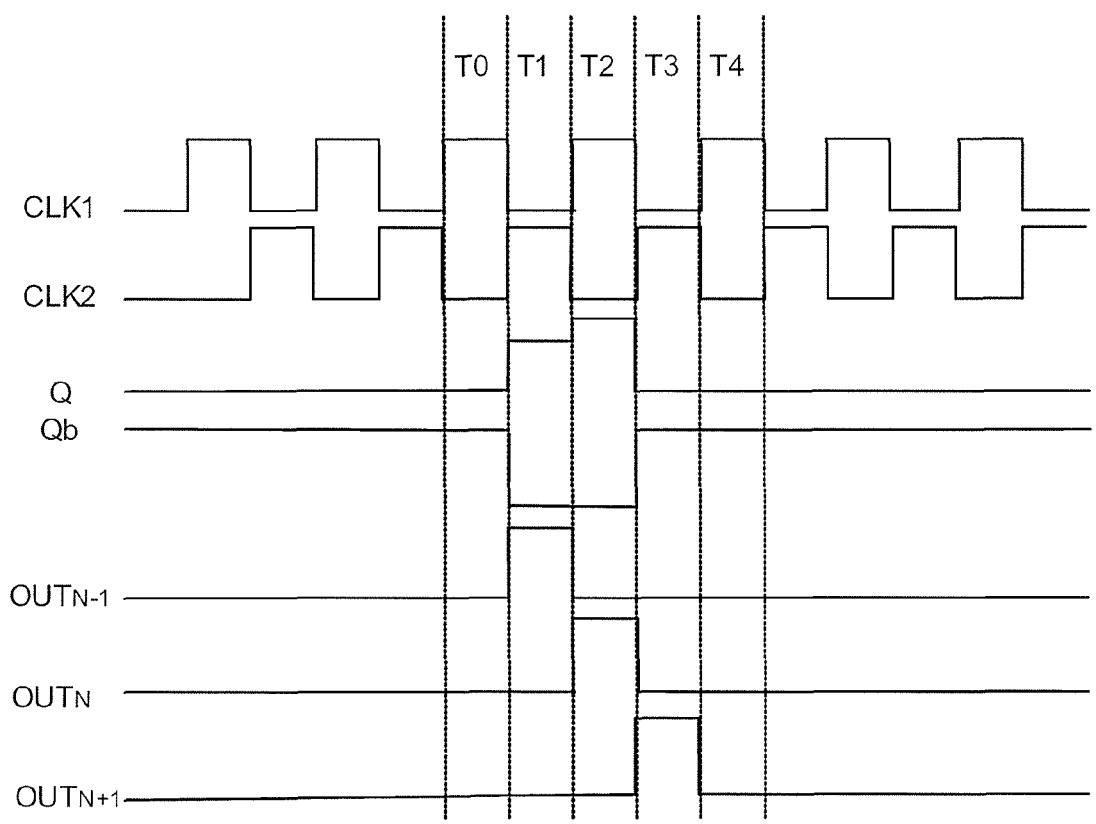
FIG. 6 is a timing chart of the operation of the gate-line drive device illustrated in FIG. 4.

FIG. 6 is a timing chart of the operation of the gate-line drive device illustrated in FIG. 4. The technical solution of the present embodiment is further explained below by the operation process of the N-th stage of shift register with reference to FIG. 5 and FIG. 6.

In FIG. 5, the first operation signal VDD1 and the second operation signal VDD2 are high level or low level respectively having the same amplitude but opposite to each other.

In particular, when the first operation signal VDD1 is a high level, the second operation signal VDD2 is a low level:

Since the second operation signal VDD2 is a low level, the twelfth thin film transistor M12 and the seventeenth thin film transistor M17 are in OFF state, at this time, the voltage of the third node Qb is a low level. Meanwhile, as the first operation signal VDD1 is a high level, the eleventh thin film transistor M11 is in ON state, which causes the voltage of the third node Qb becomes lower. This makes the ON voltages of the fourteenth thin film transistor M14 and the sixteenth thin film transistor M16 are more effectively restored to the original state.

Figure 7:
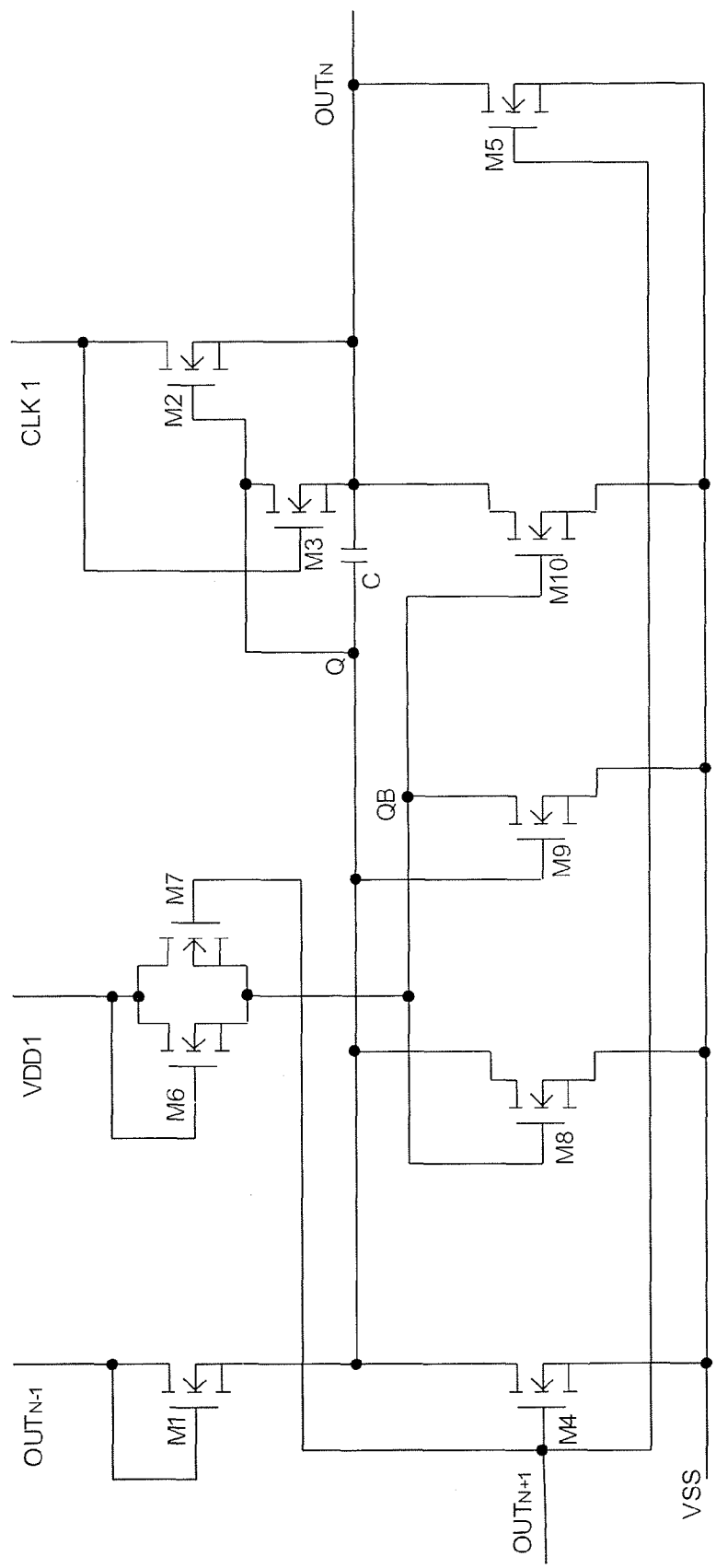
FIG. 7 is a simplified illustrative diagram of a circuit when VDD1 is a high level and VDD2 is a low level in FIG. 5.

FIG. 7 is a simplified illustrative diagram of a circuit when VDD1 is a high level and VDD2 is a low level in FIG. 5. The shift register of FIG. 5 could be equivalent to the shift register of FIG. 7.

When the first operation signal VDD1 is a low level, the second operation signal VDD2 is a high level as shown in FIG. 5:

Since the first operation signal VDD1 is a low level, the sixth thin film transistor M6 and the eleventh thin film transistor M11 are in OFF state, at this time, the voltage of the second node QB is a low level. Meanwhile, as the second operation signal VDD2 is a high level, the seventeenth thin film transistor M17 is in ON state, which causes the voltage of the second node QB becomes lower. This makes the ON voltages of the eighth thin film transistor M8 and the tenth thin film transistor M10 are more effectively restored to the original state.

Figure 8:
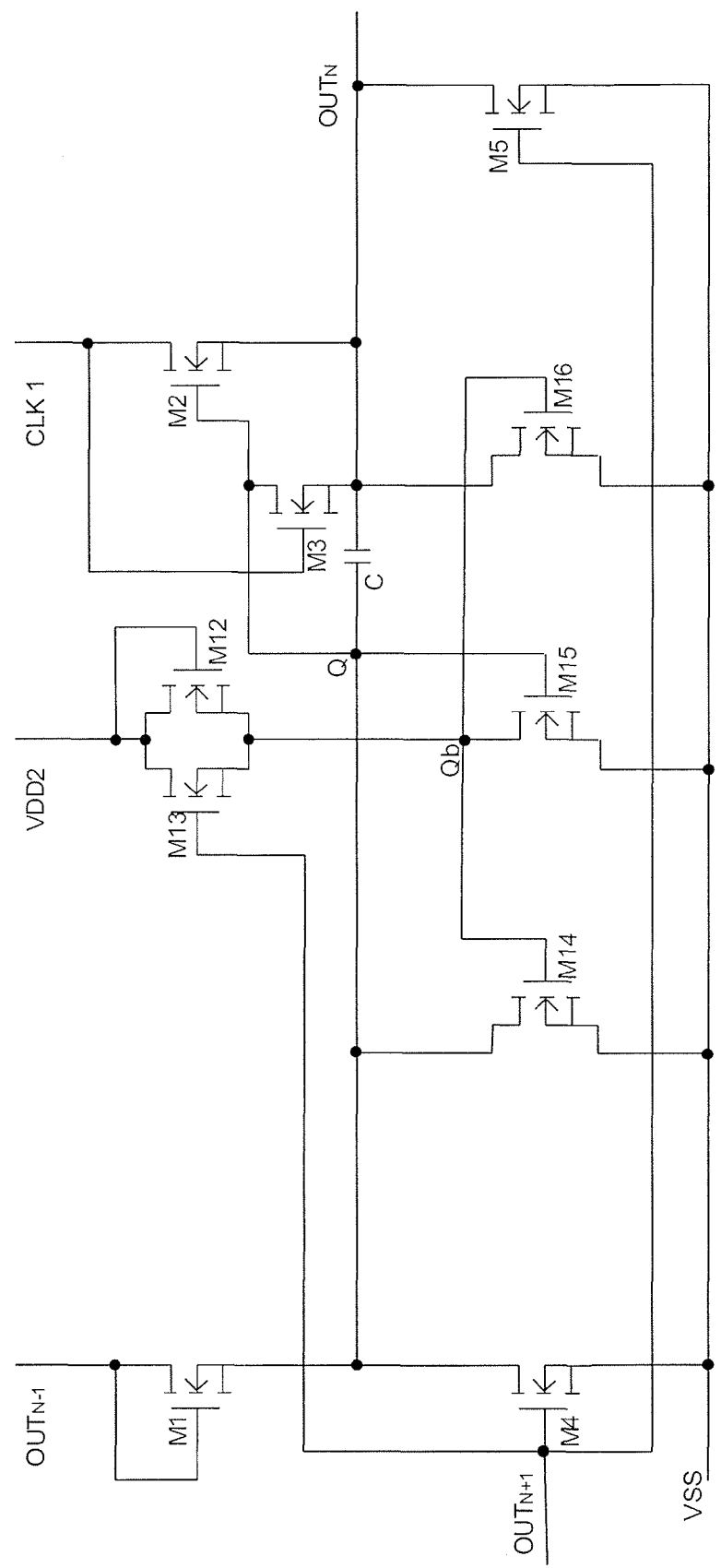
FIG. 8 is a simplified illustrative diagram of a circuit when VDD1 is a low level and VDD2 is a high level in FIG. 5.

FIG. 8 is a simplified illustrative diagram of a circuit when VDD1 is a low level and VDD2 is a high level in FIG. 5. The shift register of FIG. 5 could be equivalent to the shift register of FIG. 8.

As the operating principal of FIG. 7 and FIG. 8 is the same, as shown in FIG. 6, given example that the first operation signal VDD1 is a high level and the second operation signal VDD2 is a low level, as shown in FIG. 7, the operating process of the N-th stage of shift register is as follows:

In T0 phase, since both of the trigger signal and the feedback signal received by the shift register are a low level, this shift register is in a state of non-operation. Because VDD1 is a high level, the sixth thin film transistor M6 is in ON state, which makes the second node QB being a high level. When the second node QB is a high level, both of the eighth thin film transistor M8 and the tenth thin film transistor M10 are in ON state, then the first node Q is a low level, which could make the gate and source of the second thin film transistor M2 maintaining a low level. That is, no matter whether the clock signal CLK1 is a high level or a low level, the second thin film transistor M2 is in OFF state, always keeping the present stage output terminal $OUT_N$ as a low level, such that the interference from outside signal could be effectively prevented.

When reaching the T1 phase, the trigger signal terminal $OUT_{N-1}$ connected to the first thin film transistor M1 becomes high level; at this time, the first thin film transistor M1 is turned on. Since the feedback signal terminal $OUT_{N+1}$ is low level, the fourth thin film transistor M4 and the fifth thin film transistor M5 are turned off. At this time, the voltage of first node Q becomes high level. When the first node Q becomes high level, the ninth thin film transistor M9 is turned on, while the second node QB becomes low level. At this time, the eighth thin film transistor M8 and the tenth thin film transistor M10 are in the OFF state.

When reaching the T2 phase, the trigger signal terminal $OUT_{N-1}$ becomes low level from high level; at this time, the clock signal CLK1 becomes high level. By means of the storage capacitor C, the voltage of the first node Q keeps high level as in the T1 phase at this time. Therefore the fifteenth thin film transistor M15 is in ON state. Meanwhile, as the clock signal CLK1 becomes high level, so the third thin film transistor M3 is also in ON state. In this way, a loop is formed between the second thin film transistor M2 and the third thin film transistor M3, which could make the voltage of the first node Q reaches the voltage as high as the clock signal CLK, and make the present stage output terminal $OUT_N$ becomes high level faster, thereby effectively enhance the ability of pulling load for the second thin film transistor M2.

When reaching the T3 phase, the clock signal CLK1 changes to low level from high level. Meanwhile the feedback signal terminal $OUT_{N+1}$ changes to high level. At this time, the fourth thin film transistor M4, the seventh thin film transistor M7, the fifth thin film transistor M5 are in ON state. The first node Q becomes low level caused by the fourth thin film transistor M4, meanwhile, as the fifth thin film transistor M5 is in ON state, it begins to discharge to the present stage output terminal $OUT_N$, making the present stage output terminal $OUT_N$ changing to low level from the high level. Since the first node Q is low level, the ninth thin film transistor M9 becomes OFF state. Meanwhile the seventh thin film transistor M7 is turned on, and then the voltage of the second node QB becomes high level. In this way, the eighth thin film transistor M8 and the ninth thin film transistor M9 are turned on again, which speeds up the process that the first node Q and the present stage output terminal $OUT_N$ become low level. Thereafter the state of T0 phase is maintained, above flow is repeated until the next signal is coming.

As seen from the whole operation flow, the shift register provided in embodiment of the present invention has a stable structure, no DC current flows over the whole shift register, the operating process of the whole circuit is achieved all by the accumulation of charge, and therefore the entire circuit is a highly power-saving circuit. Also, the circuit structure has a high stability and could very effectively reduce the delayed time for the rising and falling of the signal. Thus it is possible to effectively implement a gate-line drive device consisted of a number of shift registers, which is suitable for applied to the liquid crystal panel with middle and larger size.

Figure 9:
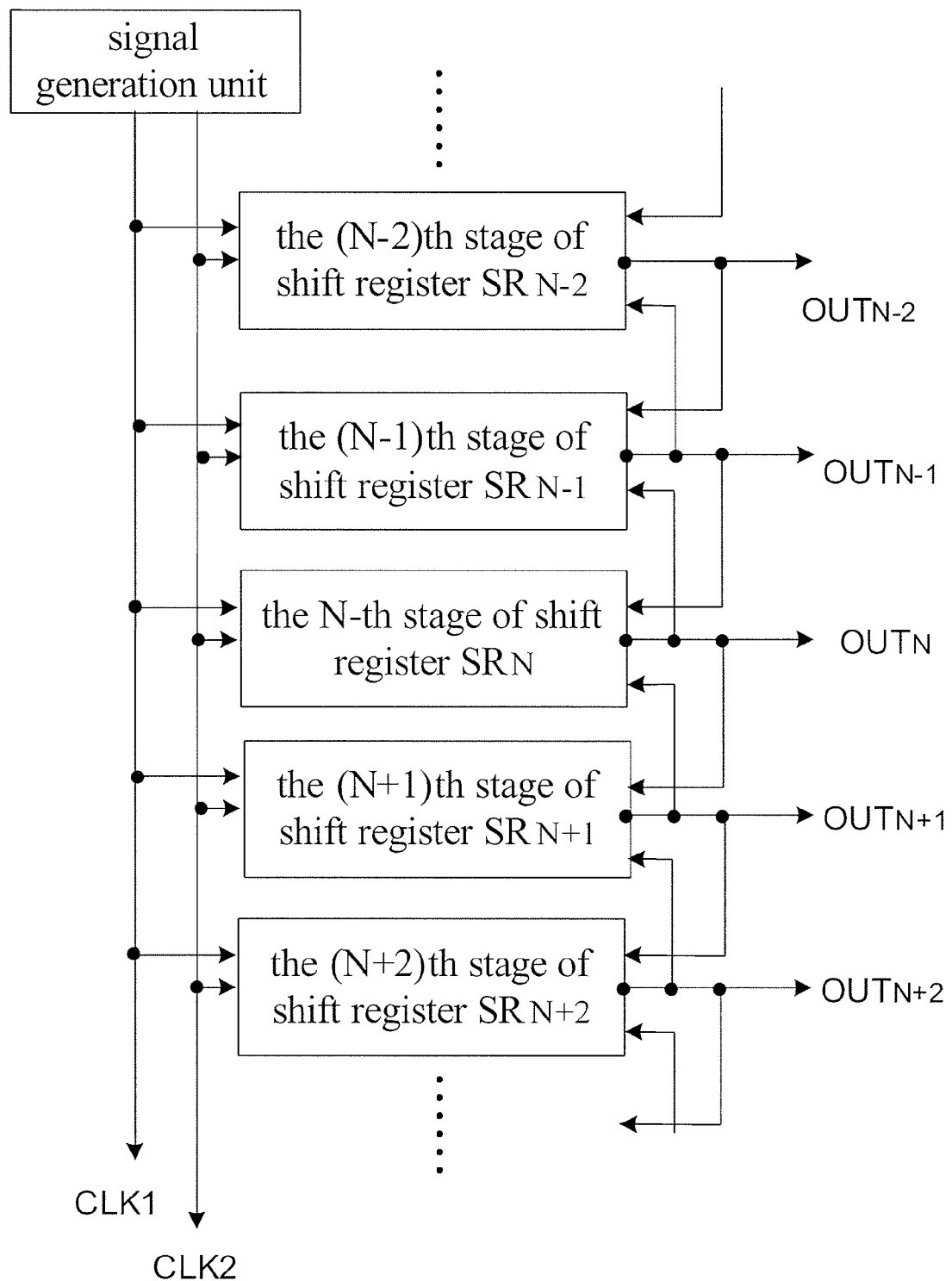
FIG. 9 is an illustrative diagram of a structure of the gate-line drive device according to a second embodiment of the present invention.

FIG. 9 is an illustrative diagram of a structure of the gate-line drive device according to a second embodiment of the present invention. As shown in FIG. 9, the structure of the present embodiment is basically same as that of the gate-line drive device of the first embodiment, with the difference that, in the present embodiment, a technical solution where VDD1 and VDD2 are replaced by the clock signal lines CLK1 and CLK2 is adopted, that is, the input signals sent from the signal generation unit are the first clock signal CLK1 and the second clock signal CLK2 which are periodically alternated, then the first operation signal terminal and the clock signal terminal receive the same one clock signal of the first clock signal CLK1 and the second clock signal CLK2, respectively; the second operation signal terminal receives the other clock signal of the first clock signal CLK1 and the second clock signal CLK2.

Figure 10:
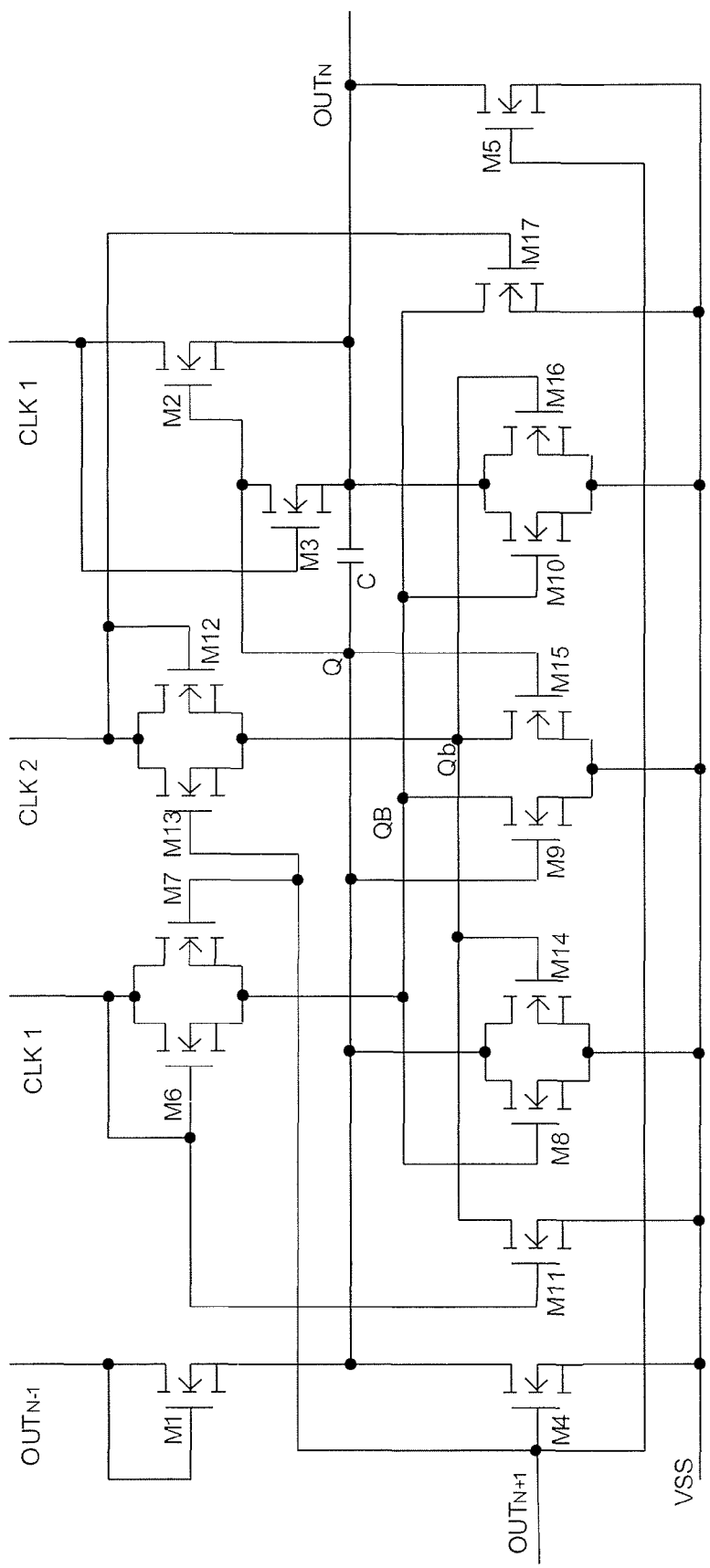
FIG. 10 is an illustrative diagram of a structure of the N-th stage of shift register of the gate-line drive device illustrated in FIG. 9.

FIG. 10 is an illustrative diagram of a structure of the N-th stage of shift register of the gate-line drive device illustrated in FIG. 9. As shown in FIG. 10, given the example of the N-th stage of shift register $SR_N$, the details of whose input terminal and output terminal are that: the signal received by the first operation signal terminal is CLK1, the signal received by the second operation signal terminal is CLK2, the signal received by the clock signal terminal is CLK1, feedback signal terminals are $OUT_{N+1}$ receiving a feedback signal from the next stage of shift register, a trigger signal terminal $OUT_{N-1}$ receiving an output signal from the output terminal of the previous stage (the (N-1)-th stage) of shift register, the output terminal of the present stage is OUT$_N$, wherein, the output terminal OUT$_N$ of the present stage also outputs a trigger signal to the next stage (the (N+1)-th stage) of shift register as its initial signal.

Figure 11:
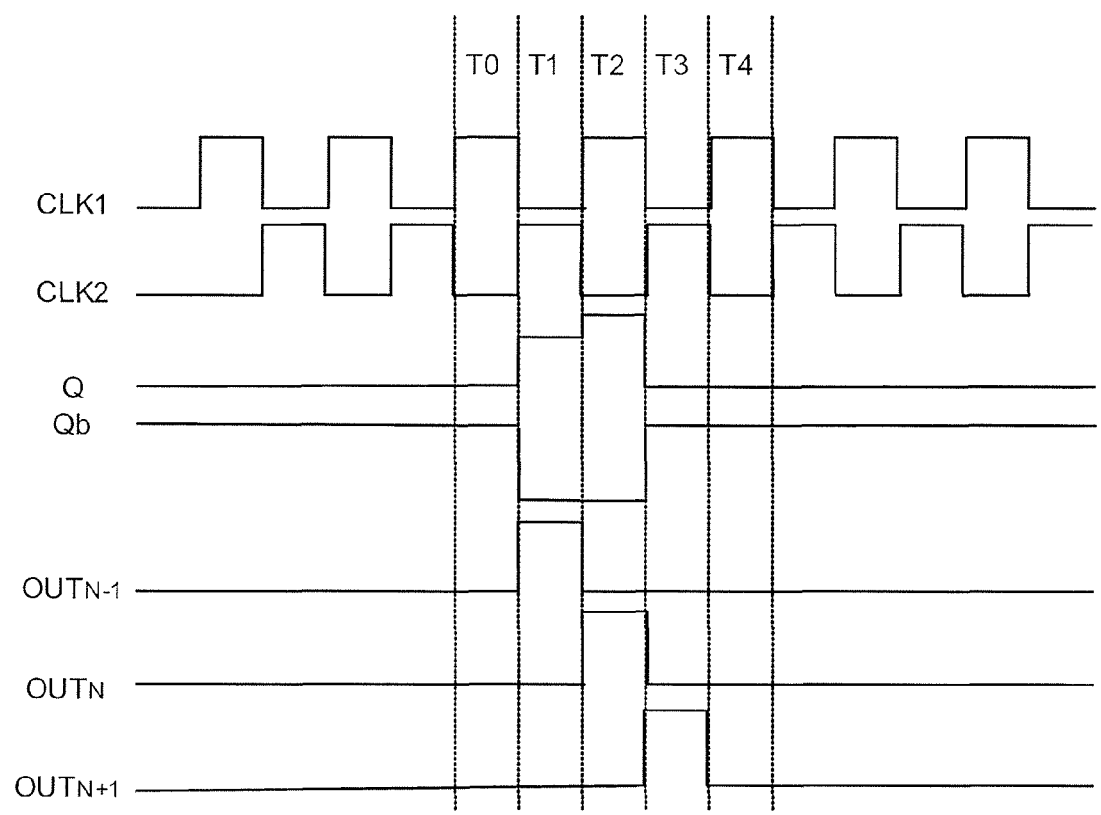
FIG. 11 is a timing chart of the operation of the gate-line drive device illustrated in FIG. 9.

FIG. 11 is a timing chart of the operation of the gate-line drive device illustrated in FIG. 9. As shown in FIG. 11, the operational principal of the shift register is similar to that of the first embodiment; herein it is no longer repeated.

The technical solution of the present embodiment adopts two alternated clock signals CLK1 and CLK2 instead of VDD1 and VDD2, the operation time duty ratio of the thin film transistors in the first operation modular and the second operation modular are both 50%, which can increase the operating life of the thin film transistors to some extent, but the effect thereof is not as good as that in case of using VDD1 and VDD2. Meanwhile, adopting two alternated clock signals CLK1 and CLK2 instead of VDD1 and VDD2 would increase the load of the clock signal line, which may cause a greater delay when driving many shift registers, affecting the normal drive of the circuit. Such technical solution is suitable for applied to the liquid crystal panel with a small size.

Figure 12:
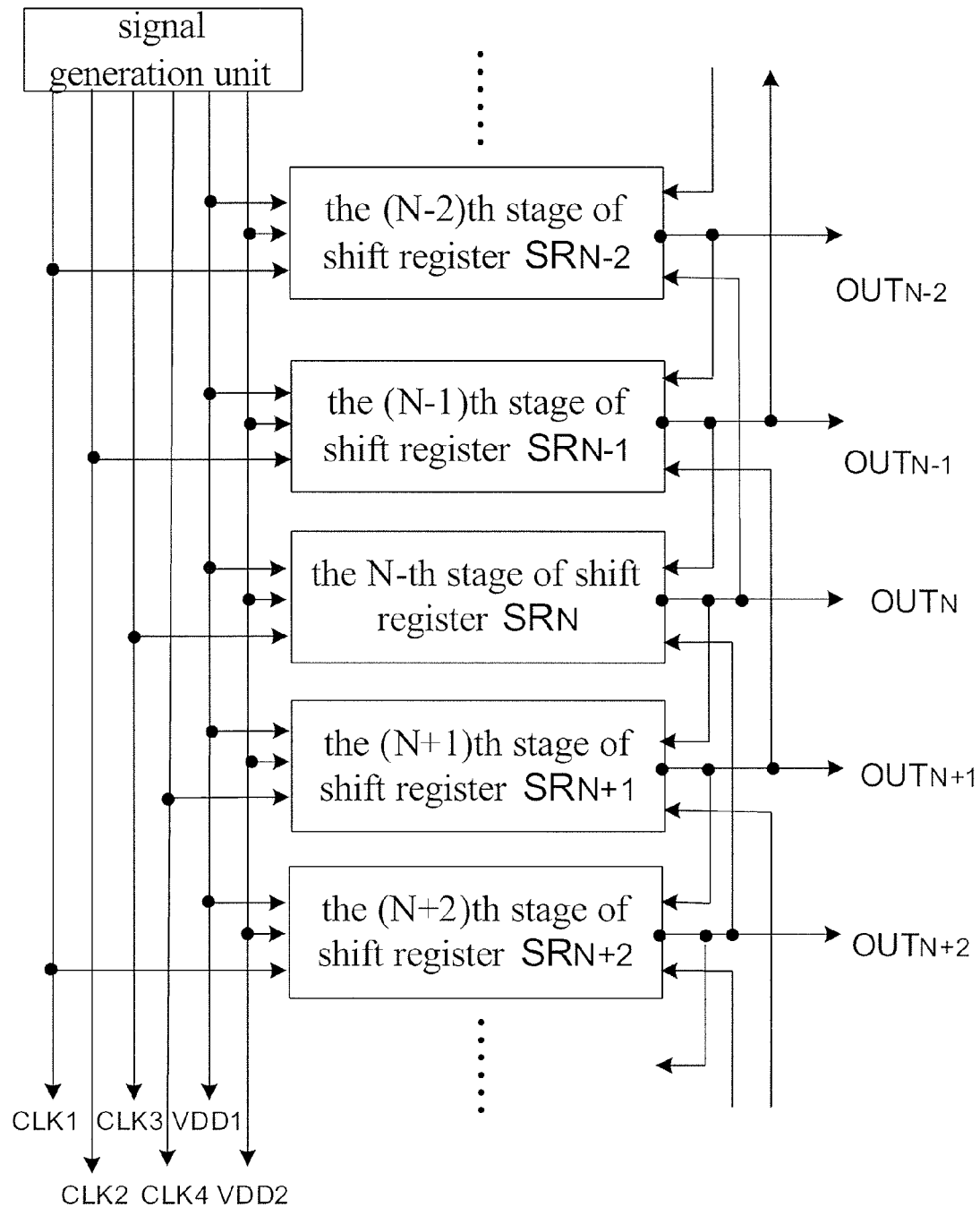
FIG. 12 is an illustrative diagram of a structure of the gate-line drive device according to a third embodiment of the present invention.

FIG. 12 is an illustrative diagram of a structure of the gate-line drive device according to a third embodiment of the present invention. As shown in FIG. 12, the five shift registers in the shift register set are the (N−2)-th stage of shift register SR$_{N-2}$, the (N−1)-th stage of shift register SR$_{N-1}$, the N-th stage of shift register SR$_N$, the (N+1)-th stage of shift register SR$_{N+1}$ and the (N+2)-th stage of shift register SR$_{N+2}$, respectively, each shift register has the structure illustrated in FIG. 3.

In the present embodiment, the input signals sent by signal generation unit are: a first operation signal VDD1 and a second operation signal VDD2 having the same amplitude but opposite to each other, and a first clock signal CLK1, a second clock signal CLK2, a third clock signal CLK3 and a fourth clock signal CLK4 being periodically sequentially outputted, then the first operation signal terminal receives the first operation signal VDD1; the second operation signal terminal receives the second operation signal VDD2; the clock signal terminal receives one clock signal of the first clock signal CLK1, the second clock signal CLK2, the third clock signal CLK3 and the fourth clock signal CLK4.

Figure 13:
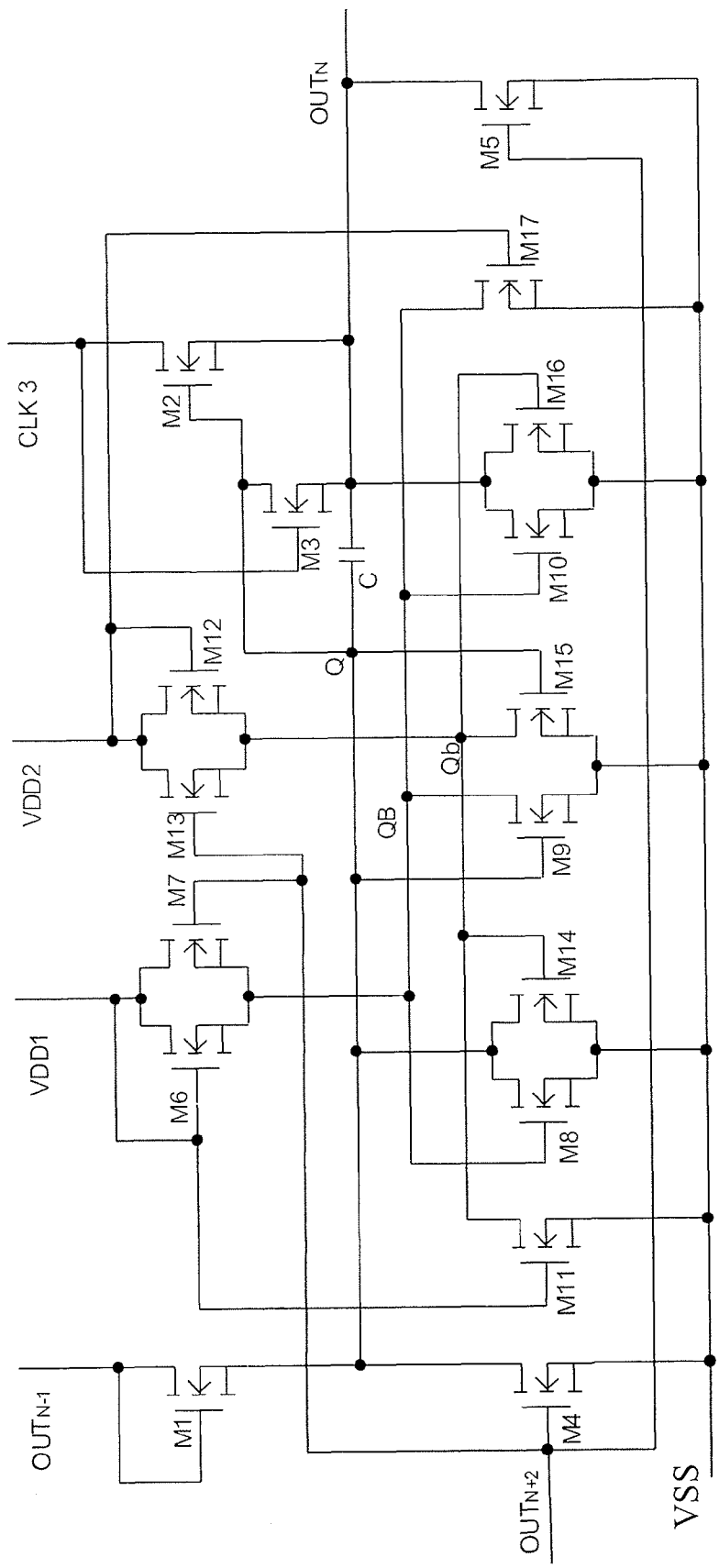
FIG. 13 is an illustrative diagram of a structure of the N-th stage of shift register of the gate-line drive device illustrated in FIG. 12.

FIG. 13 is an illustrative diagram of a structure of the N-th stage of shift register of the gate-line drive device illustrated in FIG. 12. As shown in FIG. 13, given the example of the N-th stage of shift register SR$_N$, the details of whose particular input terminal and output terminal are that: the first operation signal terminal receiving the first operation signal VDD1, the second operation signal terminal receiving the second operation signal VDD2, the clock signal terminal receiving the second clock signal CLK3, a feedback signal terminal is OUT$_{N+2}$ receiving a feedback signal from the next second stage of shift register, a trigger signal terminal OUT$_{N-1}$ receiving an output signal from the output terminal of the previous stage (the (N−1)-th stage) of shift register, the output terminal OUT$_N$ of the present stage, wherein, the output terminal OUT$_N$ of the present stage also outputs a trigger signal to the next stage (the (N+1)-th stage) of shift register as its initial signal.

Figure 14:
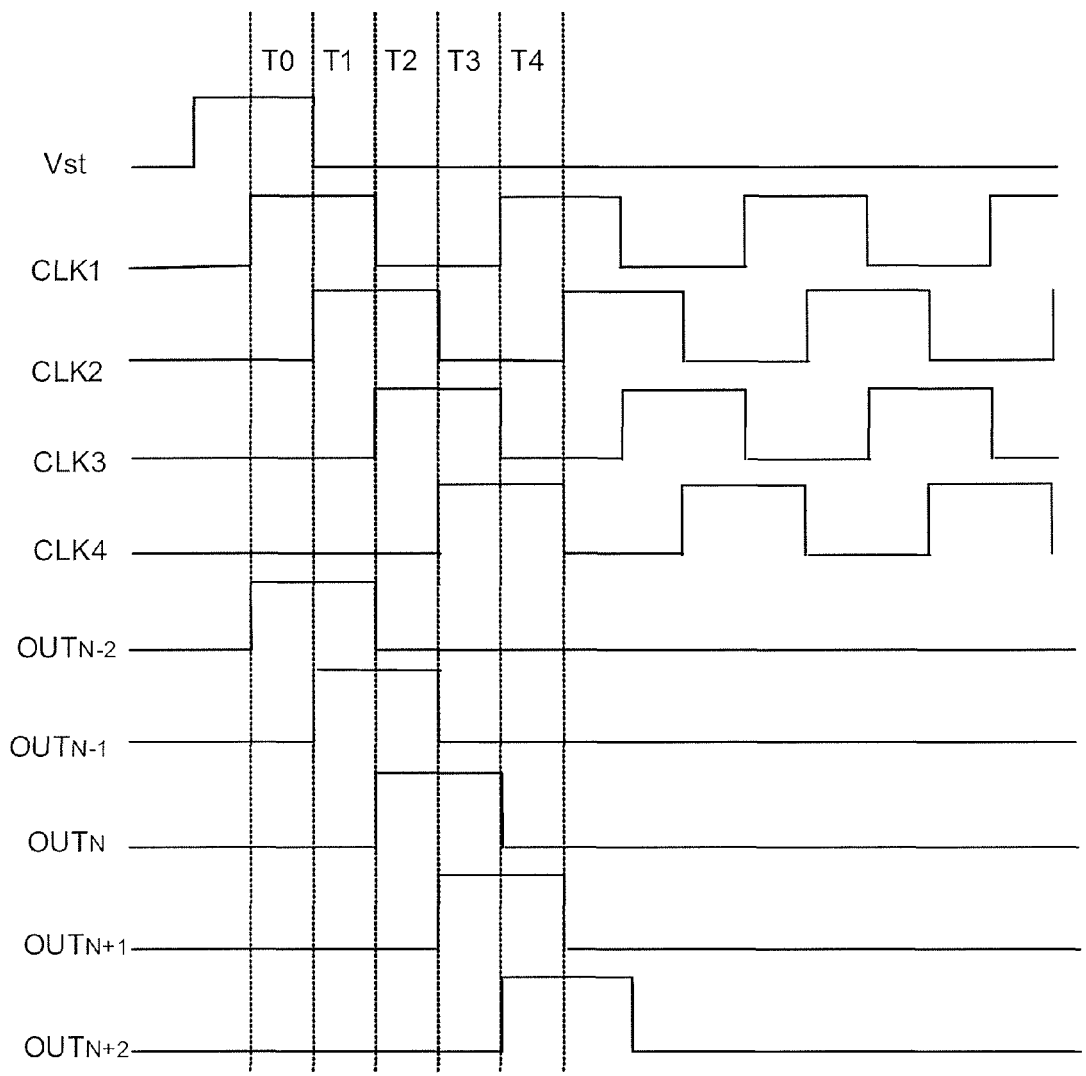
FIG. 14 is a timing chart of the operation of the gate-line drive device illustrated in FIG. 12.

FIG. 14 is a timing chart of the operation of the gate-line drive device illustrated in FIG. 12. The embodiment of the present invention provides a process of precharge during driving the gate load, such that a better effect could be achieved for pixel charging. The technical solution of the present embodiment is further explained below by the operation process of the N-th stage of shift register with reference to FIG. 14 and FIG. 15.

In FIG. 14, the first operation signal VDD1 and the second operation signal VDD2 are a high level or a low level having the same amplitude but opposite to each other.

In particular, when the first operation signal VDD1 is a high level, the second operation signal VDD2 is a low level:

Since the second operation signal VDD2 is a low level, the twelfth thin film transistor M12 and the seventeenth thin film transistor M17 are in OFF state, at this time, the voltage of the third node Qb is a low level. Meanwhile as the first operation signal VDD1 is a high level, the eleventh thin film transistor M11 is in ON state, which causes the voltage of the third node Qb becomes lower. This makes the ON voltages of the fourteenth thin film transistor M14 and the sixteenth thin film transistor M16 are more effectively restored to the original state.

Figure 15:
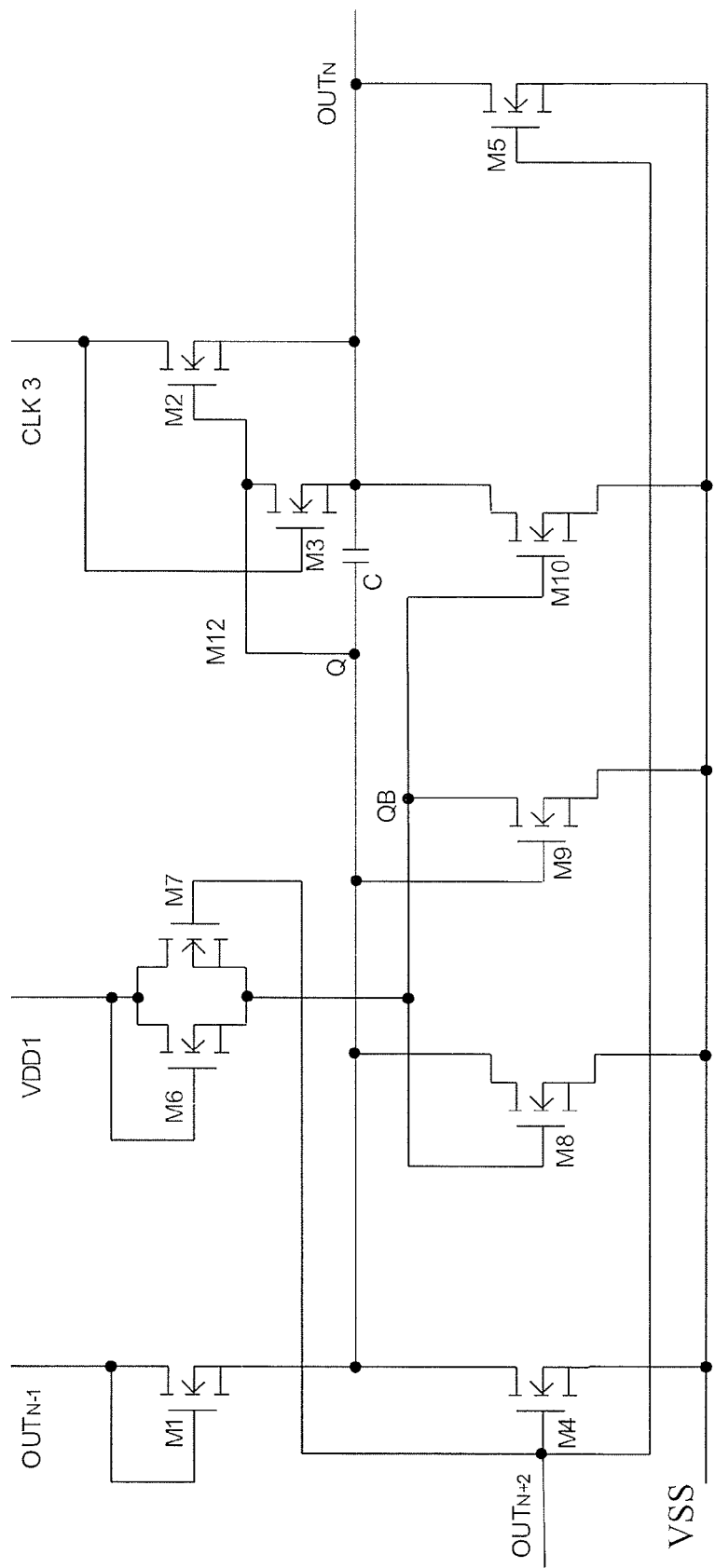
FIG. 15 is a simplified illustrative diagram of a circuit when VDD1 is a high level and VDD2 is a low level in FIG. 13.

FIG. 15 is a simplified illustrative diagram of a circuit when VDD1 is a high level and VDD2 is a low level in FIG. 13. The shift register of FIG. 13 could be equivalent to the shift register of FIG. 15.

As shown in FIG. 13, when the first operation signal VDD1 is a low level, the second operation signal VDD2 is a high level:

Since the first operation signal VDD1 is a low level, the sixth thin film transistor M6 and the eleventh thin film transistor M11 are in OFF state, at this time, the voltage of the second node QB is a low level. Meanwhile, as the second operation signal VDD2 is a high level, the seventeenth thin film transistor M17 is in ON state, which causes the voltage of the second node QB becomes lower. This makes the ON voltages of the eighth thin film transistor M8 and the tenth thin film transistor M10 are more effectively restored to the original state.

Figure 16:
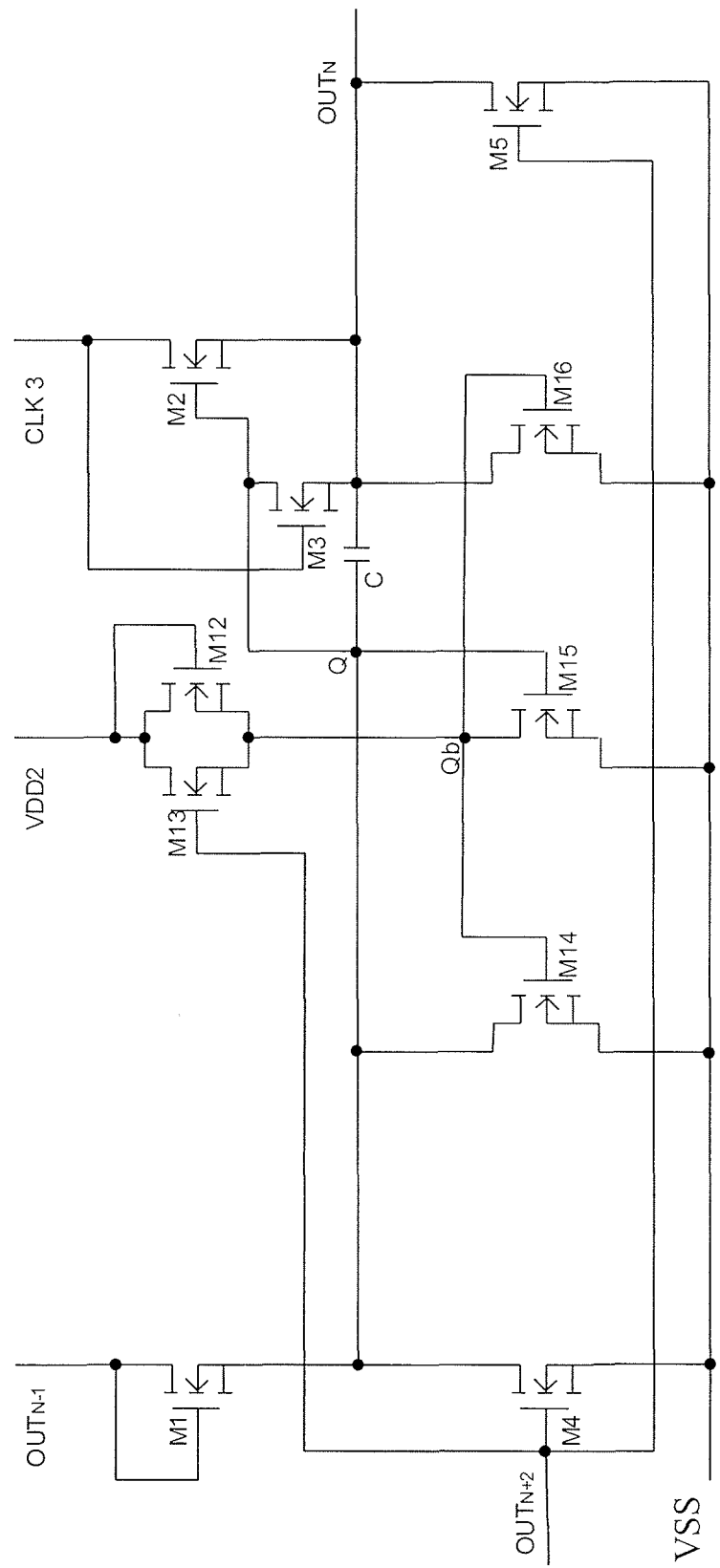
FIG. 16 is a simplified illustrative diagram of a circuit when VDD1 is a low level and VDD2 is a high level in FIG. 13.

FIG. 16 is a simplified illustrative diagram of a circuit when VDD1 is a low level and VDD2 is a high level in FIG. 13. The shift register of FIG. 13 could be equivalent to the shift register of FIG. 16.

As the operating principal of FIG. 15 and FIG. 16 is the same, as shown in FIG. 14, given example that the first operation signal VDD1 is a high level and the second operation signal VDD2 is a low level, as shown in FIG. 15, the operating process of the N-th stage of shift register is as follows:

In the beginning T0 phase, since both of the trigger signal and the feedback signal received by the shift register are low level, this shift register is in a state of non-operation. Because VDD1 is a high level, the sixth thin film transistor M6 are in ON state, which makes the second node QB is a high level. When the second node QB is a high level, the eighth thin film transistor M8 and the tenth thin film transistor M10 are both in ON state, then the first node Q is a low level, which could make the gate and source of the second thin film transistor M2 maintaining at low level. That is, no matter whether the clock signal CLK3 is a high level or a low level, the second thin film transistor M2 is turned off, always keeping the output terminal as a low level, such that the interference from outside signal could be effectively prevented.

When reaching the T1 phase, the trigger signal terminal OUT$_{N-1}$ connected to the first thin film transistor M1 becomes high level, at this time, the first thin film transistor M1 is turned on. Since the feedback signal terminal OUT$_{N+1}$ is low level, the fourth thin film transistor M4 and the fifth thin film transistor M5 are turned off. At this time, the voltage of first node Q becomes high level. When the first node Q becomes high level, the ninth thin film transistor M9 is turned on, meanwhile the second node QB becomes low level. At this time, the eighth thin film transistor M8 and the tenth thin film transistor M10 are in the OFF state, at this moment, the voltage of the firs node Q becomes higher.

When reaching the T2 phase, the trigger signal terminal OUT$_{N-1}$ still keeps as high level, at this time, the clock signal CLK3 becomes high level. At this time, the firs node Q maintains at high level, the second thin film transistor M2 is turned on. As the clock signal CLK3 becomes high level, the third thin film transistor M3 is also in ON state. In this way, a loop is formed between the second thin film transistor M2 and the third thin film transistor M3, which could make the voltage of the first node Q reaches the voltage as high as the clock signal CLK3, and make the present stage output terminal OUT$_N$ becomes high level faster, thereby effectively enhance the ability of pull up load for the second thin film transistor M2.

When reaching the T3 phase, OUT$_{N-1}$ changes to low level from high level. At this time, the clock signal CLK3 maintains at high level. By means of storage capacitor C, the voltage of the first node Q keeps high level as in the T2 phase at this time. Therefore the fifteenth thin film transistor M15 is in ON state. Thus the second node QB maintains at low level. The eighth thin film transistor M8 and the tenth thin film transistor M10 are both in OFF state. Meanwhile, as the clock signal CLK3 still maintains at high level, so the third thin film transistor M3 is also in ON state. In this way, a loop is formed between the second thin film transistor M2 and the third thin film transistor M3, which could make the voltage of the first node Q reaches the voltage as high as the clock signal CLK3, thus the present stage output terminal OUT$_N$ is kept as high level.

When reaching the T4 phase, clock signal CLK3 changes to low level from high level. Meanwhile the feedback signal terminal OUT$_{N+2}$ becomes high level. At this time, the fourth thin film transistor M4, the seventh thin film transistor M7, and the fifth thin film transistor M5 are in ON state. The first node Q becomes low level by the fourth thin film transistor M4. Meanwhile since the fifth thin film transistor M5 is in ON state, it begins to discharge to the present stage output terminal OUT$_N$, which makes the present stage output terminal OUT$_N$ changes to low level from the high level. Since the first node Q is low level, the ninth thin film transistor M9 becomes OFF state. Meanwhile the seventh thin film transistor M7 is turned on, and then the voltage of the second node QB becomes high level. In this way, the eighth thin film transistor M8 and the ninth thin film transistor M9 are turned on again, which speeds up the process that the first node Q and the present stage output terminal OUT$_N$ turn to low level.

Thereafter the state of T0 phase is maintained, the above flow is repeated until the time when the next signal is coming.

It can be seen from the entire operation flow, the shift register provided by an embodiment of the present invention has a stable structure, no direct current flows over the whole shift register, and the operating process of the whole circuit is achieved all by the accumulation of charge. Therefore the entire circuit is a highly power-saving circuit. Also, the circuit structure has a high stability and could very effectively reduce the delayed time for the rising and falling of the signal. Thus it is possible to effectively implement a gate-line drive device consisted of a number of shift registers, which is suitable for applied to the liquid crystal panel with middle and larger size.

Figure 17:
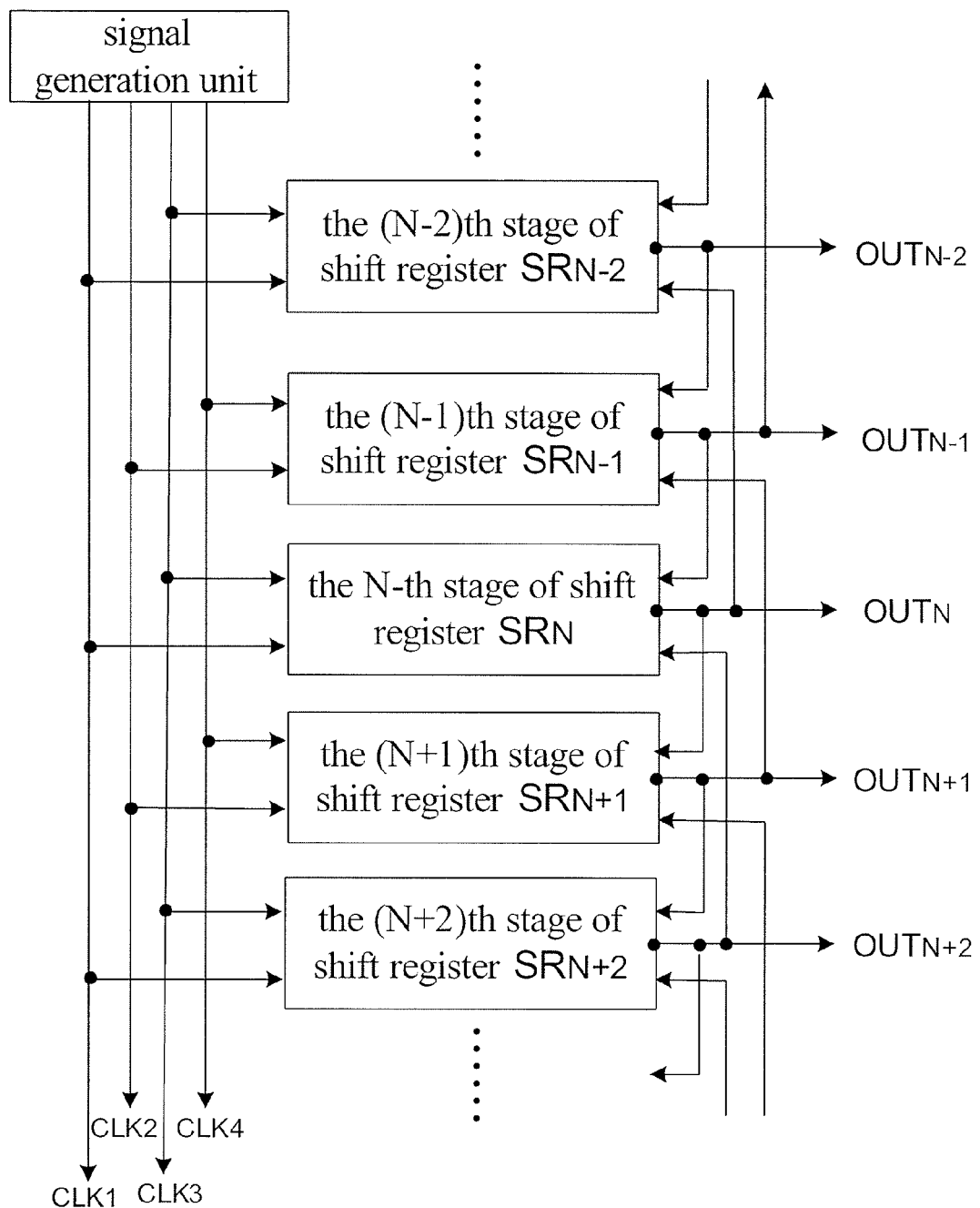
FIG. 17 is an illustrative diagram of a structure of the gate-line drive device according to a fourth embodiment of the present invention.

FIG. 17 is an illustrative diagram of a structure of the gate-line drive device according to a fourth embodiment of the present invention. As shown in FIG. 17, the structure of the present embodiment and that of the gate-line drive device of the third embodiment are basically the same with the difference that in the present embodiment, a technical solution where VDD1 and VDD2 are replaced by two clock signals among four clock signals which are periodically alternated is adopted, that is, the input signals sent from the signal generation unit are the first clock signal CLK1, the second clock signal CLK2, the third clock signal CLK3 and the fourth clock signal CLK4 which are periodically sequentially inputted, then the first operation signal terminal receives one clock signal of the first clock signal CLK1, the second clock signal CLK2, the third clock signal CLK3 and the fourth clock signal CLK4; the second operation signal terminal and the clock signal terminal receive the next clock signal, which has one clock signal interval with said one clock signal, among the first clock signal CLK1, the second clock signal CLK2, the third clock signal CLK3 and the fourth clock signal CLK4, respectively.

Figure 18:
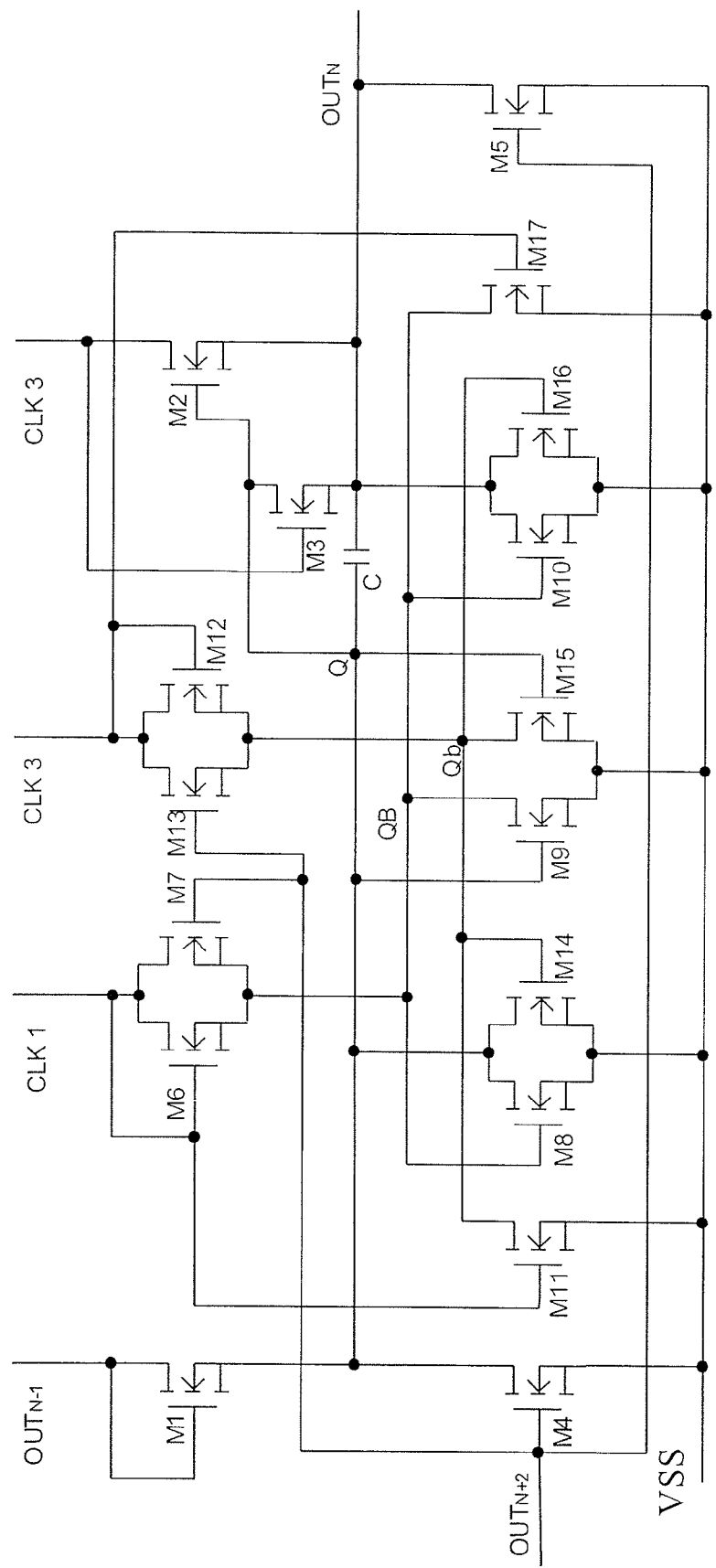
FIG. 18 is an illustrative diagram of a structure of the N-th stage of shift register of the gate-line drive device illustrated in FIG. 17.

FIG. 18 is an illustrative diagram of a structure of the N-th stage of shift register of the gate-line drive device illustrated in FIG. 17. As shown in FIG. 18, given the example of the N-th stage of shift register SR$_N$, the details of whose particular input terminal and output terminal are: the first operation signal terminal receiving the signal CLK1, the second operation signal terminal receiving the signal CLK3, the clock signal terminal receiving the signal CLK3, a feedback signal terminals are OUT$_{N+2}$ receiving a feedback signal from the next second stage of shift register, a trigger signal terminal OUT$_{N-1}$ receiving an output signal from the output terminal of the previous stage (the (N−1)-th stage) of shift register, the output terminal OUT$_N$ of the present stage, wherein, the output terminal OUT$_N$ of the present stage also outputs a trigger signal to the next stage (the (N+1)-th stage) of shift register as its initial signal.

Figure 19:
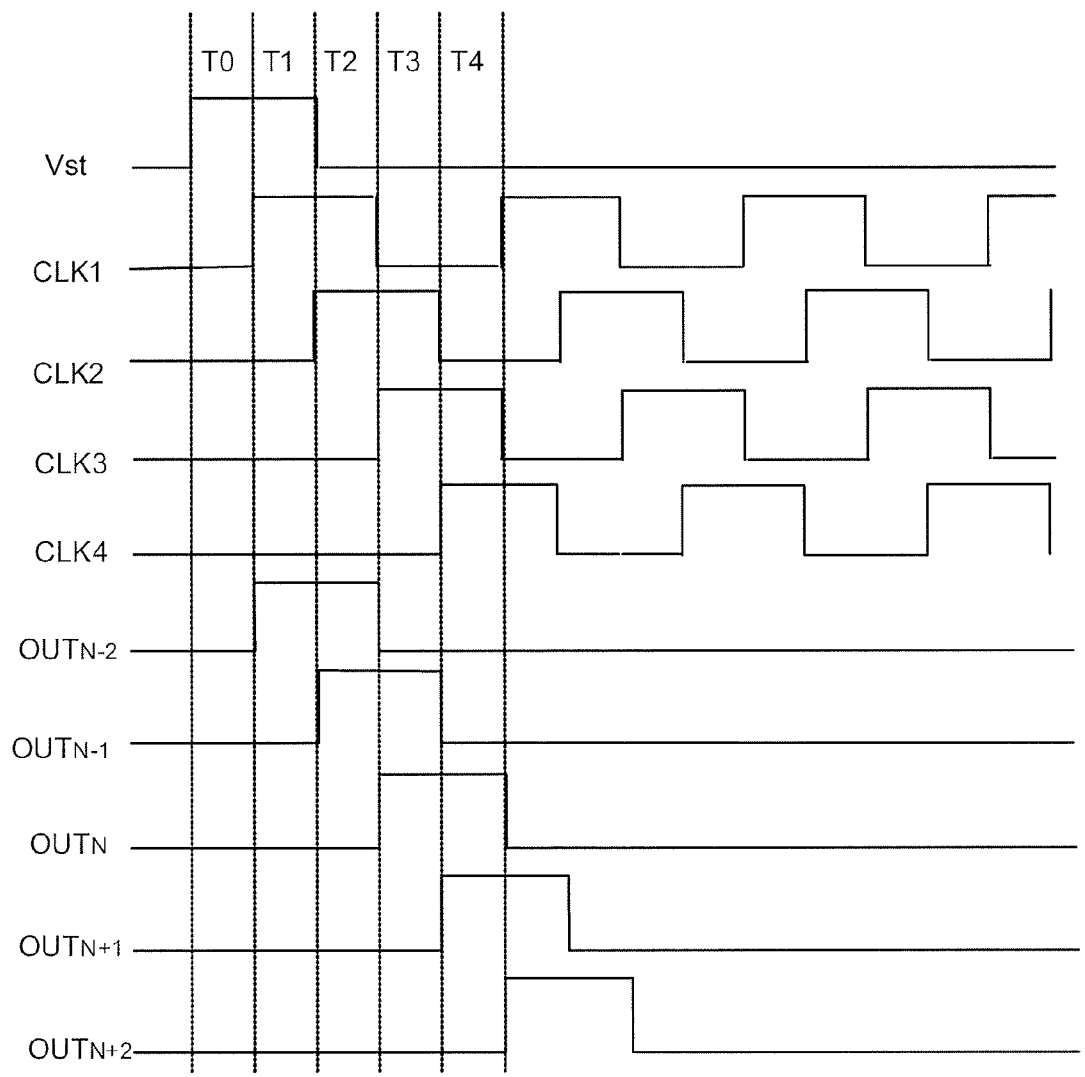
FIG. 19 is a timing chart of the operation of the gate-line drive device illustrated in FIG. 17.

FIG. 19 is a timing chart of the operation of the gate-line drive device illustrated in FIG. 17. As shown in FIG. 19, the operation principal of the shift register is similar to that of the third embodiment, further description is omitted herein.

The technical solution of the present embodiment adopts two clock signals of the four clock signal, which are periodically outputted in sequence, to replace VDD1 and VDD2, the operation time duty ratio of the thin film transistors in the first operation modular and the second operation modular are both 50%, which can increase the operating life of the thin film transistors to some extent, but the effect thereof is not as good as using VDD1 and VDD2. Meanwhile, adopting two alternated clock signals CLK1 and CLK2 to replace VDD1 and VDD2, would increase the load of the clock signal line, such may cause a greater delay when driving so many shift registers, and affect the normal drive of the circuit. Therefore, such technical solution is suitable for applied to the liquid crystal panel with a small size.

It should be noted that said thin film transistors in the above embodiment are hydrogenated amorphous silicon thin film transistors.

The above descriptions are only the certain embodiments of the present invention, the scope for protection of the present invention is not limit thereto, those skilled in the art can easily make variations or replacement within the technical area disclosed by the present invention; such variations or replacements are not departed from the scope of the invention. Thus, the scope for protection of the present invention should be judged according to the scope defined by the claims.

What is claimed is:

1. A shift register, comprising:
    a first thin film transistor having a gate and a drain connected together to a trigger signal terminal, and a source connected to a first node as a pull-up node;
    a second thin film transistor having a gate connected to the first node, a drain connected to a clock signal terminal, and a source connected to an output terminal of the present stage;

a third thin film transistor having a gate connected to the clock signal terminal, a drain connected to the first node, and a source connected to the output terminal of the present stage;

a fourth thin film transistor having a gate connected to a feedback signal terminal, a drain connected to the first node, and a source connected to a low level signal terminal;

a fifth thin film transistor having a gate connected to the feedback signal terminal, a drain connected to the output terminal of the present stage, and a source connected to a low level signal terminal;

a capacitor, connected between the first node and the output terminal of the present stage;

a first operation modular, connected between a first operation signal terminal and the first node, and connected to the low level signal terminal; and a second operation modular, connected between a second operation signal terminal and the first node, and connected to the low level signal terminal, wherein, the first operation modular and the second operation modular are alternatively operated, and the first operation modular and the second operation modular are used to maintain both of the gate and source of the second thin film transistor at low level respectively, when the shift register is not operated.

2. The shift register as claimed in claim 1, wherein the first operation modular comprises:

a sixth film transistor having a gate and a drain connected to the first operation signal terminal, and a source connected to a second node as a pull-down node;

a seventh thin film transistor having a gate connected to the feedback signal terminal, a drain connected to the first operation signal terminal, and a source connected to the second node;

a eighth thin film transistor having a gate connected to the second node, a drain connected to the first node, and a source connected to the low level signal terminal;

a ninth thin film transistor having a gate connected the first node, a drain connected to the second node, and a source connected to the low level signal terminal;

a tenth thin film transistor having a gate connected to the second node, a drain connected to the output terminal of the present stage, and a source connected to the low level signal terminal; and a eleventh thin film transistor having a gate connected to the first operation signal terminal, a drain connected to the third node as a pull-down node, and a source connected to the low level signal terminal, and the second operation modular comprises:

a twelfth thin film transistor having a gate and a drain connected to the second operation signal terminal, and a source connected to the third node;

a thirteenth thin film transistor having a gate connected to the feedback signal terminal, a drain connected to the first operation signal terminal, and a source connected to the third node;

a fourteenth thin film transistor having a gate connected to the third node, a drain connected to the first node, and a source connected to the low level signal terminal;

a fifteenth thin film transistor having a gate connected to the first node, a drain connected to the third node, and a source connected to the low level signal terminal;

a sixteenth thin film transistor having a gate connected to the third node, a drain connected to the output terminal of the present stage, and a source connected to the low level signal terminal; and a seventeenth thin film transistor having a gate connected to the second operation signal terminal, a drain connected to second node, and a source connected to the low level signal terminal.

3. The shift register as claimed in claim 2, wherein the sixth thin film transistor and the thirteenth thin film transistor have the same structure; the seventh thin film transistor and the twelfth thin film transistor have the same structure; the eighth thin film transistor and the fourteenth thin film transistor have the same structure; the ninth thin film transistor and the fifteenth thin film transistor have the same structure; the tenth thin film transistor and the sixteenth thin film transistor have the same structure; the eleventh thin film transistor and the seventeenth thin film transistor have the same structure.

4. A gate-line drive device comprising the shift register according to claim 1, comprising plurality of shift registers connected with a signal generation unit, wherein the shift register has a clock signal terminal, a first operation signal terminal, a second operation signal terminal, an output terminal of the present stage, a trigger signal terminal receiving an output signal from the previous stage of shift register and an feedback signal terminal receiving an output signal from the next stage of shift register; and the shift register receives at least two of the input signals sent from the signal generation unit.

5. The gate-line drive device as claimed in claim 4, wherein the input signals sent from the signal generation unit are a first operation signal and a second operation signal having the same amplitude but opposite to each other, and a first clock signal and a second clock signal which are periodically alternated, the process that shift register receives at least two of the input signals sent from the signal generation unit comprising:

receiving the first operation signal from the first operation signal terminal;

receiving the second operation signal from the second operation signal terminal; and receiving one clock signal of the first clock signal and the second clock signal from the clock signal terminal.

6. The gate-line drive device as claimed in claim 4, wherein the input signals sent from the signal generation unit are a first clock signal and a second clock signal which are periodically alternated, the process that shift register receives at least two of the input signals sent from the signal generation unit comprising:

the first operation signal terminal and the clock signal terminal respectively receive the same one clock signal of the first clock signal and the second clock signal; and the second operation signal terminal receives the other clock signal of the first clock signal and the second clock signal.

7. The gate-line drive device as claimed in claim 4, wherein the first operation modular comprises:

a sixth film transistor having a gate and a drain connected to the first operation signal terminal, and a source connected to a second node as a pull-down node;

a seventh thin film transistor having a gate connected to the feedback signal terminal, a drain connected to the first operation signal terminal, and a source connected to the second node;

a eighth thin film transistor having a gate connected to the second node, a drain connected to the first node, and a source connected to the low level signal terminal;

a ninth thin film transistor having a gate connected the first node, a drain connected to the second node, and a source connected to the low level signal terminal;

a tenth thin film transistor having a gate connected to the second node, a drain connected to the output terminal of the present stage, and a source connected to the low level signal terminal; and a eleventh thin film transistor having a gate connected to the first operation signal terminal, a drain connected to the third node as a pull-down node, and a source connected to the low level signal terminal, and the second operation modular comprises:

a twelfth thin film transistor having a gate and a drain connected to the second operation signal terminal, and a source connected to the third node;

a thirteenth thin film transistor having a gate connected to the feedback signal terminal, a drain connected to the first operation signal terminal, and a source connected to the third node;

a fourteenth thin film transistor having a gate connected to the third node, a drain connected to the first node, and a source connected to the low level signal terminal;

a fifteenth thin film transistor having a gate connected to the first node, a drain connected to the third node, and a source connected to the low level signal terminal;

a sixteenth thin film transistor having a gate connected to the third node, a drain connected to the output terminal of the present stage, and a source connected to the low level signal terminal; and a seventeenth thin film transistor having a gate connected to the second operation signal terminal, a drain connected to second node, and a source connected to the low level signal terminal.

8. The gate-line drive device as claimed in claim 7, wherein the sixth thin film transistor and the thirteenth thin film transistor have the same structure; the seventh thin film transistor and the twelfth thin film transistor have the same structure; the eighth thin film transistor and the fourteenth thin film transistor have the same structure; the ninth thin film transistor and the fifteenth thin film transistor have the same structure; the tenth thin film transistor and the sixteenth thin film transistor have the same structure; the eleventh thin film transistor and the seventeenth thin film transistor have the same structure.

9. The gate-line drive device as claimed in claim 7, wherein the input signals sent from the signal generation unit are a first operation signal and a second operation signal having the same amplitude but opposite to each other, and a first clock signal and a second clock signal which are periodically alternated, the process that shift register receives at least two of the input signals sent from the signal generation unit comprising:

receiving the first operation signal from the first operation signal terminal;

receiving the second operation signal from the second operation signal terminal; and receiving one clock signal of the first clock signal and the second clock signal from the clock signal terminal.

10. The gate-line drive device as claimed in claim 7, wherein the input signals sent from the signal generation unit are a first clock signal and a second clock signal which are periodically alternated, the process that shift register receives at least two of the input signals sent from the signal generation unit comprising:

the first operation signal terminal and the clock signal terminal respectively receive the same one clock signal of the first clock signal and the second clock signal; and the second operation signal terminal receives the other clock signal of the first clock signal and the second clock signal.

11. The gate-line drive device as claimed in claim 8, wherein the input signals sent from the signal generation unit are a first operation signal and a second operation signal having the same amplitude but opposite to each other, and a first clock signal and a second clock signal which are periodically alternated, the process that shift register receives at least two of the input signals sent from the signal generation unit comprising:

receiving the first operation signal from the first operation signal terminal;

receiving the second operation signal from the second operation signal terminal; and receiving one clock signal of the first clock signal and the second clock signal from the clock signal terminal.

12. The gate-line drive device as claimed in claim 8, wherein the input signals sent from the signal generation unit are a first clock signal and a second clock signal which are periodically alternated, the process that shift register receives at least two of the input signals sent from the signal generation unit comprising:

the first operation signal terminal and the clock signal terminal respectively receive the same one clock signal of the first clock signal and the second clock signal; and the second operation signal terminal receives the other clock signal of the first clock signal and the second clock signal.

13. A gate-line drive device comprising the shift register according to claim 1, comprising plurality of shift registers connected in serial, wherein the shift register has a clock signal terminal, a first operation signal terminal, a second operation signal terminal, an output terminal of the present stage, a trigger signal terminal receiving an output signal from the previous stage of shift register and a feedback signal terminal receiving an output signal from the next second stage of shift register; and the shift register receives at least two of the input signals sent from a signal generation unit.

14. The gate-line drive device as claimed in claim 13, wherein the input signals sent from the signal generation unit are a first operation signal and a second operation signal which are periodically alternated, and a first clock signal, a second clock signal, a third clock signal and a fourth clock signal which are periodically outputted in sequence, the process that the shift register receives at least two of the input signals sent from the signal generation unit comprising:

receiving the first operation signal from the first operation signal terminal;

receiving the second operation signal from the second operation signal terminal; and receiving a clock signal of the first clock signal, a second clock signal, a third clock signal and a fourth clock signal from the clock signal terminal.

15. The gate-line drive device as claimed in claim 13, the input signals sent from the signal generation unit are a first clock signal, a second clock signal, a third clock signal and a fourth clock signal which are periodically outputted in sequence, the process that the shift register receives at least two of the input signals sent from the signal generation unit comprising:

receiving one clock signal of the first clock signal, a second clock signal, a third clock signal and a fourth clock signal from the first operation signal terminal, and receiving a next clock signal, which has a clock signal interval with said one clock signal, among the first clock signal, the second clock signal, the third clock signal and the fourth clock signal from the second operation signal terminal and the clock signal terminal, respectively.

16. The gate-line drive device as claimed in claim 13, wherein
the first operation modular comprises:
a sixth film transistor having a gate and a drain connected to the first operation signal terminal, and a source connected to a second node as a pull-down node;
a seventh thin film transistor having a gate connected to the feedback signal terminal, a drain connected to the first operation signal terminal, and a source connected to the second node;
a eighth thin film transistor having a gate connected to the second node, a drain connected to the first node, and a source connected to the low level signal terminal;
a ninth thin film transistor having a gate connected the first node, a drain connected to the second node, and a source connected to the low level signal terminal;
a tenth thin film transistor having a gate connected to the second node, a drain connected to the output terminal of the present stage, and a source connected to the low level signal terminal; and
a eleventh thin film transistor having a gate connected to the first operation signal terminal, a drain connected to the third node as a pull-down node, and a source connected to the low level signal terminal, and
the second operation modular comprises:
a twelfth thin film transistor having a gate and a drain connected to the second operation signal terminal, and a source connected to the third node;
a thirteenth thin film transistor having a gate connected to the feedback signal terminal, a drain connected to the first operation signal terminal, and a source connected to the third node;
a fourteenth thin film transistor having a gate connected to the third node, a drain connected to the first node, and a source connected to the low level signal terminal;
a fifteenth thin film transistor having a gate connected to the first node, a drain connected to the third node, and a source connected to the low level signal terminal;
a sixteenth thin film transistor having a gate connected to the third node, a drain connected to the output terminal of the present stage, and a source connected to the low level signal terminal; and
a seventeenth thin film transistor having a gate connected to the second operation signal terminal, a drain connected to second node, and a source connected to the low level signal terminal.

17. The gate-line drive device as claimed in claim 16, wherein
the sixth thin film transistor and the thirteenth thin film transistor have the same structure; the seventh thin film transistor and the twelfth thin film transistor have the same structure; the eighth thin film transistor and the fourteenth thin film transistor have the same structure; the ninth thin film transistor and the fifteenth thin film transistor have the same structure; the tenth thin film transistor and the sixteenth thin film transistor have the same structure; the eleventh thin film transistor and the seventeenth thin film transistor have the same structure.

18. The gate-line drive device as claimed in claim 16, wherein the input signals sent from the signal generation unit are a first operation signal and a second operation signal which are periodically alternated, and a first clock signal, a second clock signal, a third clock signal and a fourth clock signal which are periodically outputted in sequence, the process that the shift register receives at least two of the input signals sent from the signal generation unit comprising:
receiving the first operation signal from the first operation signal terminal;
receiving the second operation signal from the second operation signal terminal; and
receiving a clock signal of the first clock signal, a second clock signal, a third clock signal and a fourth clock signal from the clock signal terminal.

19. The gate-line drive device as claimed in claim 16, wherein the input signals sent from the signal generation unit are a first clock signal, a second clock signal, a third clock signal and a fourth clock signal which are periodically outputted in sequence, the process that the shift register receives at least two of the input signals sent from the signal generation unit comprising:
receiving one clock signal of the first clock signal, a second clock signal, a third clock signal and a fourth clock signal from the first operation signal terminal; and
receiving a next clock signal, which has a clock signal interval with said one clock signal, among the first clock signal, the second clock signal, the third clock signal and the fourth clock signal from the second operation signal terminal and the clock signal terminal, respectively.

20. The gate-line drive device as claimed in claim 17, wherein the input signals sent from the signal generation unit are a first operation signal and a second operation signal which are periodically alternated, and a first clock signal, a second clock signal, a third clock signal and a fourth clock signal which are periodically outputted in sequence, the process that the shift register receives at least two of the input signals sent from the signal generation unit comprising:
receiving the first operation signal from the first operation signal terminal;
receiving the second operation signal from the second operation signal terminal; and
receiving a clock signal of the first clock signal, a second clock signal, a third clock signal and a fourth clock signal from the clock signal terminal.

21. The gate-line drive device as claimed in claim 17, wherein the input signals sent from the signal generation unit are a first clock signal, a second clock signal, a third clock signal and a fourth clock signal which are periodically outputted in sequence, the process that the shift register receives at least two of the input signals sent from the signal generation unit comprising:
receiving one clock signal of the first clock signal, a second clock signal, a third clock signal and a fourth clock signal from the first operation signal terminal, and
receiving a next clock signal, which has a clock signal interval with said one clock signal, among the first clock signal, the second clock signal, the third clock signal and the fourth clock signal from the second operation signal terminal and the clock signal terminal, respectively.

* * * * *